(12) United States Patent
Ueyanagi et al.

(10) Patent No.: US 6,564,634 B2
(45) Date of Patent: May 20, 2003

(54) SEMICONDUCTOR SENSOR CHIP AND METHOD FOR PRODUCING THE CHIP, AND SEMICONDUCTOR SENSOR AND PACKAGE FOR ASSEMBLING THE SENSOR

(75) Inventors: Katsumichi Ueyanagi, Kawasaki (JP); Mutsuo Nishikawa, Kawasaki (JP); Mitsuo Sasaki, Kawasaki (JP)

(73) Assignee: Fuji Electric Co., Ltd., Kanagawa (JP)

( * ) Notice: Subject to any disclaimer, the term of this patent is extended or adjusted under 35 U.S.C. 154(b) by 0 days.

(21) Appl. No.: 09/957,242

(22) Filed: Sep. 21, 2001

(65) Prior Publication Data

US 2002/0007678 A1 Jan. 24, 2002

Related U.S. Application Data

(60) Division of application No. 09/241,096, filed on Feb. 1, 1999, now Pat. No. 6,332,359, which is a continuation-in-part of application No. 09/160,189, filed on Sep. 25, 1998, now abandoned, which is a continuation-in-part of application No. 09/061,876, filed on Apr. 17, 1998, now abandoned.

(30) Foreign Application Priority Data

Apr. 24, 1997 (JP) .............................. 9-107537
Sep. 26, 1997 (JP) .............................. 9-261369
Jan. 30, 1998 (JP) ............................ 10-019086

(51) Int. Cl.$^7$ ................................................ G01P 3/00
(52) U.S. Cl. ........................................................ 73/493
(58) Field of Search ................................. 73/493, 431

(56) References Cited

U.S. PATENT DOCUMENTS 4,553,436 A * 11/1985 Hansson .................. 73/514.33

(List continued on next page.)

FOREIGN PATENT DOCUMENTS

| JP | 1-259264 | 10/1989 |
|---|---|---|
| JP | 1-301176 | 12/1989 |
| JP | 05-273229 | 10/1993 |
| JP | 07-159432 | 6/1995 |
| JP | 07-198745 | 8/1995 |
| JP | 07-244071 | 9/1995 |
| JP | 8-94663 | 4/1996 |
| JP | 8-233848 | 9/1996 |
| JP | 08-236782 | 9/1996 |
| JP | 08-236785 | 9/1996 |
| JP | 08248058 | 9/1996 |
| JP | 8-320341 | 12/1996 |
| JP | 9-318652 | 12/1997 |

Primary Examiner—Richard A. Moller
(74) Attorney, Agent, or Firm—Venable; Robert J. Frank; Keith G. Haddaway

(57) ABSTRACT

The present invention is a semiconductor sensor package for incorporating a semiconductor sensor chip. The main surface for mounting the semiconductor sensor chip is formed at a predetermined angle with respect to the surface of a printed circuit board for mounting the package. The main surface is provided with a plurality of terminals along two opposite sides for connecting with the input/output terminals of the semiconductor sensor chip and a bottom surface perpendicular to the main surface with a plurality of pins respectively formed along two sides parallel to the main surface. The plurality of pins are inserted into mounting holes formed in the printed circuit board, and the plurality of terminals provided along parallel sides the pins are electrically connected.

7 Claims, 36 Drawing Sheets

U.S. PATENT DOCUMENTS

| | | | |
|---|---|---|---|
| 5,121,180 A | * 6/1992 | Beringhause et al. | 73/514.34 |
| 5,121,633 A | * 6/1992 | Murakami et al. | 73/514.36 |
| 5,239,870 A | * 8/1993 | Kaneko | 73/514.33 |
| 5,352,635 A | * 10/1994 | Tu et al. | 73/514.36 |
| 5,408,112 A | * 4/1995 | Tai et al. | 73/514.36 |
| 5,503,016 A | 4/1996 | Koen | |
| 5,554,806 A | 9/1996 | Mizuno et al. | |
| 5,616,863 A | 4/1997 | Koen | |
| 5,671,161 A | * 9/1997 | Bennet et al. | 364/560 |
| 5,723,353 A | 3/1998 | Muenzel et al. | |
| 5,763,783 A | * 6/1998 | Asada | 73/514.31 |
| 5,773,881 A | 6/1998 | Kato | |
| 5,783,748 A | 7/1998 | Otani | |
| 5,783,750 A | 7/1998 | Otani | |
| 6,115,261 A | * 9/2000 | Platt et al. | 361/760 |
| 6,145,380 A | * 11/2000 | MacGugan | 73/493 |
| 6,195,261 B1 | * 2/2001 | Babutzka et al. | 361/752 |
| 6,199,429 B1 | * 3/2001 | Hirosawa | 73/504.15 |

* cited by examiner

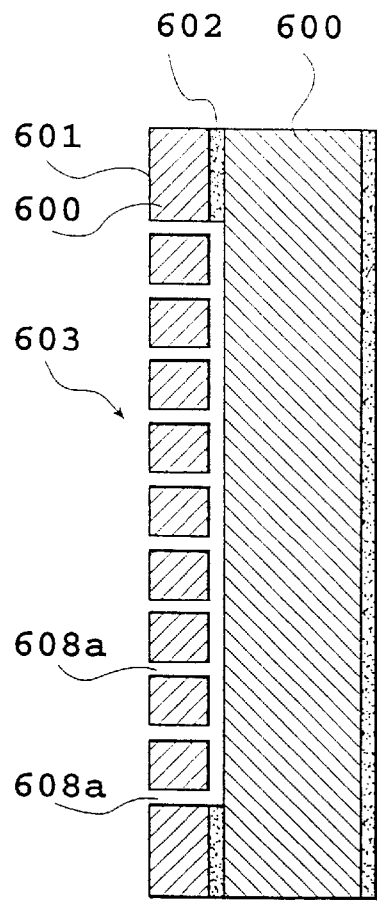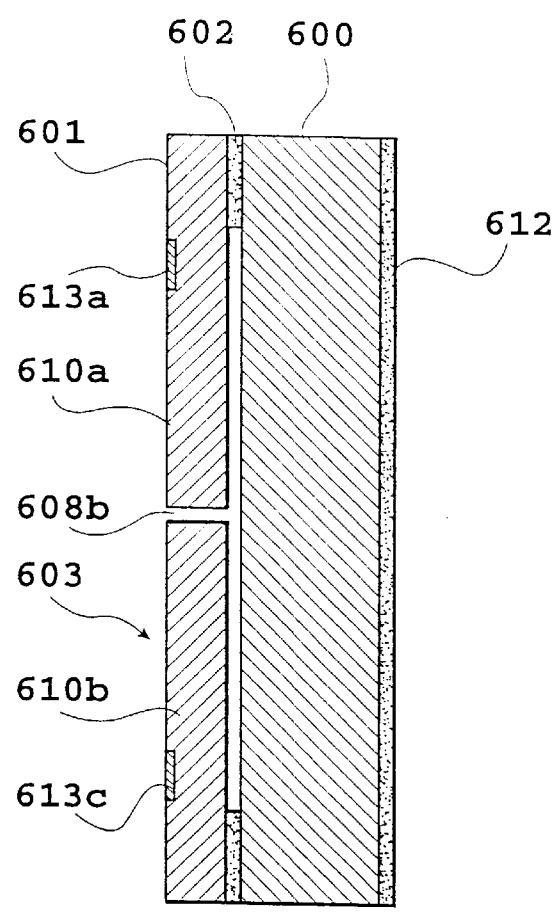
*FIG.24A* *FIG.24B*

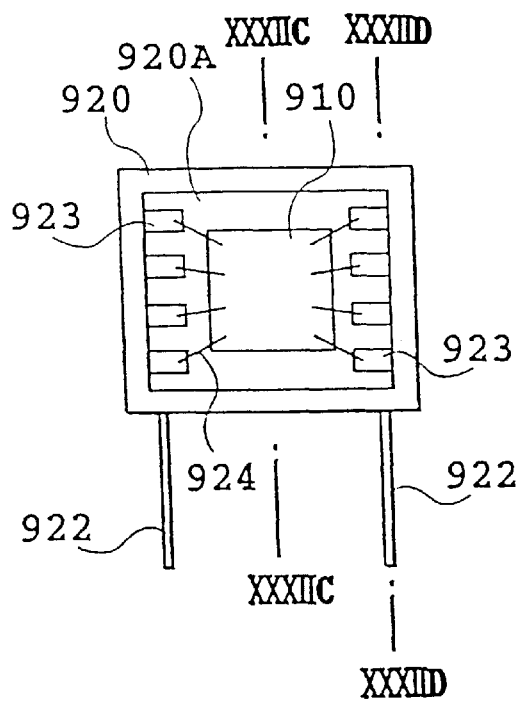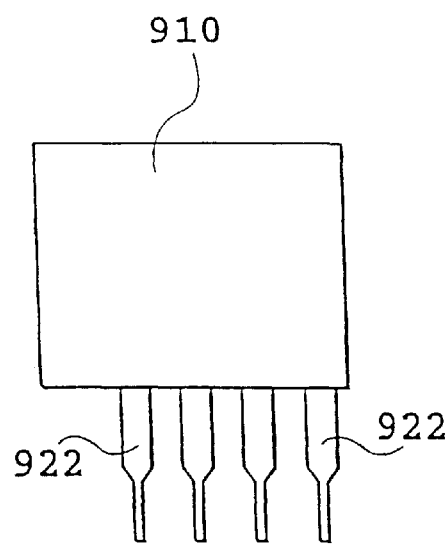
*FIG.32A*  *FIG.32B*
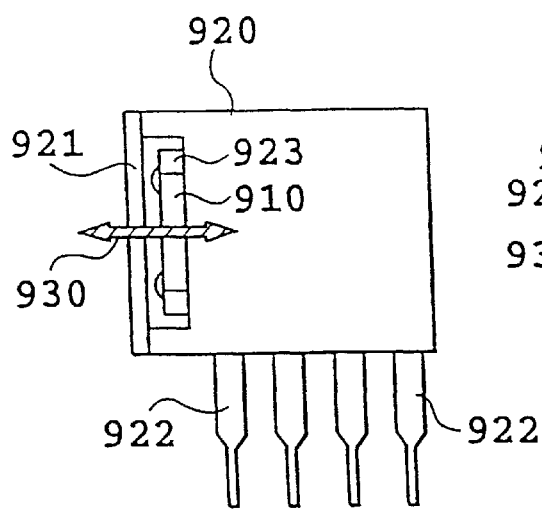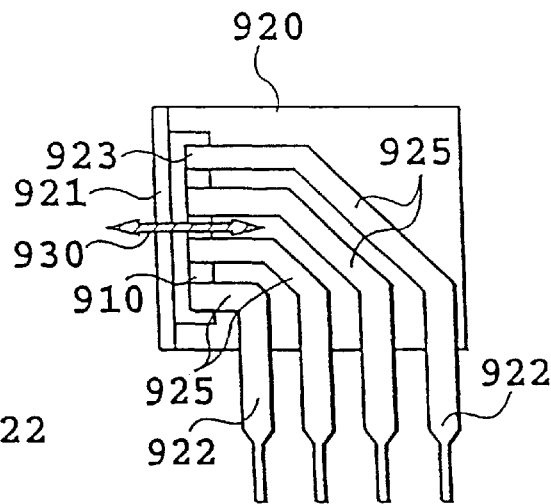
*FIG.32C*  *FIG.32D*

SEMICONDUCTOR SENSOR CHIP AND METHOD FOR PRODUCING THE CHIP, AND SEMICONDUCTOR SENSOR AND PACKAGE FOR ASSEMBLING THE SENSOR

CROSS-REFERENCE TO RELATED APPLICATIONS

This is divisional of application Ser. No. 09/241,096, filed Feb. 1, 1999 now U.S. Pat. No. 6,332,359 which is a continuation-in-part of abandoned application Ser. No. 09/160,189 filed on Sep. 25, 1998 which is a continuation-in-part of abandoned application Ser. No. 09/061,876 filed Apr. 17, 1998.

BACKGROUND OF THE INVENTION

1. Field of the Invention

The present invention relates to a semiconductor sensor chip used in a wide range of applications such as automobile, aircraft, medical service, measurement, and calibration, and to a production method for manufacturing the sensor chip. It also relates to a semiconductor sensor comprising the semiconductor sensor chip, and to a package for assembling the semiconductor sensor.

2. Description of the Related Art

An example of a conventional acceleration sensor chip disclosed in Japanese Patent No. 2551625 is shown in FIG. 1A and FIG. 1B. FIG. 1A is a perspective diagram, and FIG. 1B is a sectional diagram taken along line IB—IB of FIG. 1A. In this semiconductor acceleration sensor chip, a silicon single crystal is etched to form a support frame 1, weight parts 2a and 2b, a beam part 3a for connecting the weight part 2a and the weight part 2b, and beam parts 3b and 3c for connecting the weight part 2a, the weight part 2b and the support frame with each other. Gauge resistors 4a, 4b, 4c, and 4d are provided on the beam parts 3a, 3b, and 3c, and a Wheatstone bridge is formed of these gauge resistors. When an acceleration is exerted in a direction shown by the arrow in FIG. 1B, resistances of the gauge resistors are changed. The acceleration sensor chip measures the acceleration utilizing changes of the resistances.

In general, in the semiconductor acceleration sensor chip of this kind, a silicon substrate is deeply etched from the backside to form thick-walled weight parts of about 300 $\mu$m to 400 $\mu$m and thin-walled beam parts of about 10 $\mu$m to 50 $\mu$m. As the silicon substrate, a 4 inch wafer is often used. The reason for this is as follows:

Because the substrate is required to be deeply etched to form a thin beam part, a small wafer thickness is advantageous in terms of productivity due to the limitation of processing time. A wafer size which can be handled in the process with a thickness of about 300 $\mu$m to 400 $\mu$m, corresponding to the thickness of the beam part, is about 4 inches, and a larger wafer of 5 or 6 inches is substantially difficult to handle. Further, as shown in FIG. 1B, a wafer before dicing is formed with a number of thin-walled, low resonance frequency beam parts and is low in rigidity. A shock applied during dicing tends to generate a resonance phenomenon of the sensor part or the wafer itself, and there is a danger of an excessive displacement or stress applied to the beam parts. Consequently, the wafer size is limited because of this handling.

In the case of the above-described semiconductor acceleration sensor chip, greater part of the cost is determined by chip size and wafer size. When acceleration sensor chips are produced with the same technical level, if the wafer size is large, a large number of chips can be processed in a single batch process, and the unit price of the chip is naturally reduced. However, in the above-described prior art, usable wafer size is limited, and cost reduction can only be achieved by reduction of the chip size. However, the chip size reduction is limited as it may reduce production yield. Further, in the future, with the trend to larger diameter semiconductor wafers, a decrease in supply of 4-inch wafers is anticipated. If such an acceleration sensor chip is achieved with larger-diameter wafers of 5 inches, 6 inches or the like, a beam part of 10 $\mu$m to 30 $\mu$m in thickness must be formed from a silicon substrate of about 600 $\mu$m to 700 $\mu$m in thickness, which not only increases the etching time but also leads to a reduced production yield.

Another example of a prior art acceleration sensor chip is one which is disclosed in Japanese Laid-Open Patent Application No. 8-248058.

The second prior art example will be described with reference to FIGS. 2A and 2B. FIG. 2A is a perspective diagram of the acceleration sensor chip. FIG. 2B is a schematic diagram showing the structure of a comb electrode unit as part of the acceleration sensor chip.

This acceleration sensor chip has a three-layered structure comprising a first layer (support plate) 10, a second layer 11 as an insulation layer on the first layer, and a third layer 12 coated thereon. For example, it comprises a SOI (silicon-on-insulator) or epitaxial polysilicon wafer (polysilicon as a third layer grown on a single crystal silicon substrate through an insulation layer).

The third layer 12 is provided with a displaceable first support body 13 separated from the first layer 10 and a non-displaceable second support body 16 which is connected with the first layer 10. The first support body 13 has a mass body 15 disposed at the center and a plurality of first plates 14 extending in a direction perpendicular to the mass body 15. The second support body 16 has two mounting parts 18 straightly disposed at both ends and a plurality of second plates 17 extending in a direction perpendicular to the mounting parts 18. The second layers 11 disposed at lower parts of the plurality of first plates 14 and the mass body 15 are removed by etching so that the first support body 13 is displaceable in parallel with respect to the surface of the first layer 10.

Further, the plurality of first plates 14 and the plurality of second plates 17 respectively form comb electrodes, which, when the displaceable mass body displaces in a direction perpendicular to the first plate 14, measure an acceleration by utilizing a change in capacitance between the first plate 14 and the second plate 17. Still further, a conductor 19 for conducting these comb electrodes to an external circuit is electrically insulated from the first layer 10 by the second layer (insulation layer) 11, and further electrically insulated from the third layer 12 by a cutout 20.

In the capacitive type acceleration sensor chip using comb electrodes of this type, in order to increase the change in capacitance to affect an increase in sensitivity, it is necessary to form a structure with a decreased rigidity of a movable electrode (first plate 14). There are two factors that cause variations in sensitivity when such a sensor is constructed. A first factor is a variation in rigidity of the movable electrode (first plate 14) that is dependent on the production precision, and where the sensitivity is small when the rigidity is high. A second factor is the variation of gap between the movable electrode (first plate 14) and a fixed electrode (second plate 17), where the sensitivity decreases as the gap increases.

With respect to the first sensitivity variation factor, in general, production methods such as wet etching, RIE (Reactive Ion Etching), plasma etching and the like are used in process for producing the gap between the movable electrode and the fixed electrode and in the process of producing the support part of the movable electrode. With these production methods, since etching speed in a depth direction varies depending on the processing width, a variation occurs in the processing shape depending on the width of etching pattern. To prevent this, it is necessary to make a complex mask design in consideration of the etching speed which varies for every pattern width, resulting in a complicated process.

The second sensitivity variation factor will now be described in detail. In a sensor chip using a wafer in which polysilicon is formed as a third layer through an insulation layer on a single crystal silicon substrate or a SOI wafer, the second layer comprising an insulation layer, such as $SiO_2$, between the first layer and the third layer and a passivation film for protecting circuits on an upper surface of the third layer are formed. As a result, there is a loss of balance in the internal stress between a surface on the side where the second and third layers are disposed on the first layer which controls the rigidity of wafer, and the opposite back surface, resulting in a warped wafer. Therefore, there is a problem in that due to such a warping of wafer, a strain occurs in the sensor structure formed on the third layer, thereby, there is variation in the gap between the movable electrode and the fixed electrode constituting the comb electrodes, for example, of the capacitive type sensor chip. Yet further, there is another problem in that in an initial state before measurement when such a detected physical amount is not yet generated, generation of a strain results in an increase in offset, which requires a complicated correction circuit.

Further, in the acceleration sensor chip, after the insulation layer is etched to form a number of sensor chips, in a subsequent process such as a dicing process to divide it into discrete chips, there is a problem in that foreign matter may enter the gaps between the comb electrodes. Also, static electricity generated during sensor operation may attract foreign matter from other packaged parts to the sensor part. Depending on the size of entering foreign matter, operation of the comb electrodes may be disturbed. Even when the size of the entering foreign matter is small enough that the matter does not disturb the operation of the comb electrodes, depending on the characteristics of the entering foreign matter, capacitance between the comb electrodes may be varied. Still further, there is another problem in that, when an epitaxial polysilicon wafer is used, since polysilicon is produced by a film forming apparatus such as a CVD apparatus, even if the same in outer dimensions, a deviation occurs in mechanical characteristics such as internal stress or breakdown stress, resulting in degraded reliability of the sensor chip.

The sensor chip is incorporated in a package 60, forming a semiconductor sensor. FIG. 3 shows an example of a prior art semiconductor sensor. In this prior art example, an acceleration sensor chip 50, for detecting an acceleration in a direction 70 perpendicular to the chip surface, is mounted on a printed circuit board 80 so that the perpendicular direction of the chip surface is correctly in line with the direction 70 of the acceleration. More specifically, a package 60 incorporating the acceleration sensor chip 50 is fixed with a sensor retaining pin 91 to a high-rigidity substrate 90, and the high-rigidity substrate 90 is mounted on the printed circuit board. Package terminals 61, electrically connected with input/output terminals (not shown) of the acceleration sensor chip, are connected to terminals 81 of the printed circuit with wiring 82. A similar construction to the semiconductor acceleration sensor shown in FIG. 3 is described in Japanese Patent Application Laid-open No. 8-94663 (1996) (U.S. patent application Ser. No. 08/189,948).

The sensor chip illustrated in FIG. 1A and FIG. 1B, for example, is used as the acceleration sensor chip 50. As for the semiconductor sensor illustrated in FIG. 3, it is possible to obtain an output according to the acceleration generated in the direction 70 perpendicular to the surface of the acceleration sensor chip 50.

However, the above-described prior art acceleration sensor has the following problems:

Because the acceleration sensor package 60 is mounted on the printed circuit board 80 through the high-rigidity substrate 90, the area required for mounting is increased, and the entire acceleration measuring system, including the printed circuit board 80, is increased in size.

Mechanical vibration of the wiring 82 transmits vibration to the sensor package, resulting in mechanical noise. Further, since the wiring 82 is located in a three-dimensional space, it tends to cause an induction noise from outside the sensor chip.

A process for fixing the package 60 to the high-rigidity substrate 90, a process for wiring from the package 60 to the printed circuit board 80 and the like are required. These processes are difficult to automate, resulting in increased assembly cost.

SUMMARY OF THE INVENTION

A first object of the present invention is to solve the above-described problems in prior art conventional semiconductor sensor chips.

Specifically, a first object of the present invention is to solve the following problems:
(i) in an acceleration sensor chip using a simple piece of single crystal silicon wafer, use of a thick, large-diameter wafer is difficult,
(ii) in a capacitive type acceleration sensor chip using SOI wafer or epitaxial polysilicon wafer,
  a) increasing the sensor sensitivity is difficult,
  b) in the dicing process after removing the insulation layer, foreign matter may enter the sensor structure,
  c) variations of sensitivity and offset are large because of the strain of sensor caused by the warping of wafer.
  d) detection capacity is changed by foreign matter, and
  e) the sensor structure possesses less reliable mechanical characteristics.

A second object of the present invention is to provide a semiconductor sensor and a semiconductor sensor package which solves the problems of conventional semiconductor sensors mentioned above by reducing the mounting area, preventing generation of mechanical and induction noises due to wiring, and lowering the mounting cost.

To achieve the first object, in accordance with one aspect of the invention, there is provided an acceleration sensor chip comprising a support frame part, and a sensor structure including at least one displaceable weight part, and a beam part for connecting the weight part to the support part. The support frame part and the sensor structure are formed on a silicon substrate through an insulation layer, wherein the insulation layer between the sensor structure and the silicon substrate is removed. The beam part comprises a plurality of sets of beams which are parallel to each other, the weight part is connected to the support frame part by the plurality of sets of parallel beams, and at least two semiconductor strain gauges are formed on the surface of at least one set of the plurality of sets of parallel beams.

In this case, there is preferably one weight part, the plurality of sets of parallel beams are protrudingly formed to four corner parts of the weight part, and four semiconductor gauges are respectively formed on the surfaces of the plurality of sets of beams, thus forming a Wheatstone bridge. In an alternative case, there are preferably two weight parts, the plurality of sets of parallel beams are formed between the two weight parts and the support frame part and between the two weight parts, at least one semiconductor strain gauge is formed on the respective surface of (a) at least one of beams (b) between one of the two weight parts and the support frame part of the plurality of sets of parallel beams, at least one of beams between the other of the two weight parts and the support frame part, and (c) a beam between the two weight parts, and a Wheatstone bridge is formed of the semiconductor strain gauges.

Further, preferably, the thickness of the beam part is smaller than that of the weight part.

Still further, in the acceleration sensor chip according to the present invention, a sensor structure comprises a displaceable weight part having a magnetic thin film formed on the surface and a beam part for connecting the weight part to the support frame part, the sensor structure being formed on a silicon substrate through an insulation layer, the insulation layer between the sensor structure and the silicon substrate removed, and, on the support frame part on the periphery of the weight part, a coil is formed to surround the weight part.

Further, according to another aspect, there is provided an acceleration sensor chip comprising a support frame part, and a plurality of sensor structures including displaceable weight parts respectively having magnetic films formed on the surfaces, and beam parts for connecting the weight parts to the support frame part, the support frame part and the sensor structures being formed on a silicon substrate through an insulation layer, wherein the insulation layer between the plurality of sensor structures and the silicon substrate is removed, coils are respectively formed surrounding the weight parts on the support frame part on the periphery of the respective weight parts, and the plurality of coils are connected in series.

Here, it is preferable that a plurality of sensor groups comprising the respective plurality of sensor structures and the plurality of detection coils connected in series, the sensor groups differing in numbers of the sensor structures, and the detection coils are formed on a same semiconductor chip.

In the above-described acceleration sensor chip, it is desirable to further provide a means for performing a self diagnosis, and an amplifier circuit and a digital adjustment circuit are formed on the semiconductor chip on which the acceleration sensor chip is formed.

According to a yet further aspect, there is provided an angular acceleration sensor chip comprising a first sensor group including a first support frame part, and a plurality of first sensor structures comprising displaceable first weight parts having magnetic thin films formed on the respective surfaces and first beam parts for connecting the first weight parts to the first support part, the first support frame part and the first sensor structures being formed on a silicon substrate through an insulation layer, wherein the insulation layer between the plurality of first sensor structures and the silicon substrate is removed, first detection coils are respectively formed surrounding the first weight parts on the first support frame part on the respective periphery of the first weight parts, and the plurality of first detection coils are connected in series;

a second sensor group including a second support frame part, and a plurality of second sensor structures comprising displaceable second weight parts having magnetic thin films formed on their respective surfaces and second beam parts for connecting the second weight parts to the second support frame part, the second support frame part and the second sensor structures being formed on the silicon substrate through an insulating layer, wherein the insulating layer between the plurality of sensor structures and the silicon substrate is removed, second detection coils are respectively formed surrounding the second weight parts on the second support part on the respective periphery of the second parts, and the plurality of second detection coils are connected in series, the first and second sensor groups being formed on a same semiconductor chip;

the first sensor group and the second sensor group are equal in number of sensor structures, and the first sensor group and the second sensor group are disposed symmetrically about a detection axis as an axis of symmetry, the first and second detection coils of the first and second sensor groups form closed loops so that currents flowing through the plurality of first and second detection coils of the first and second sensor groups flow in the same direction when an angular acceleration generates about the detection axis. This embodiment may further comprise means for amplifying signals from the plurality of first and second detection coils and means for integrating outputs from the plurality of detection coils to output an angular acceleration signal.

According to a yet further aspect, there is provided an acceleration sensor chip characterized in that a third layer is formed on a first layer of a support substrate through an insulating second layer, the third layer has a sensor structure, and the second layer between a detection surface of the sensor structure and the first layer is removed, and, a beam part having a detection device, and a weight part having a plurality of cutouts of a same width formed over the entire surface are provided on the detection surface of the sensor structure with the second layer removed.

Here, it is preferable that a film of a material having a smaller thermal expansion coefficient than the material of the first layer be formed on the backside of the first layer.

Further, it is desirable that the same width of the plurality of cutouts formed on the sensor structure be a width of 2 $\mu$m or less.

Still further, as a substrate comprising the first layer, the second layer and the third layer, a silicon-on-insulator substrate may be used, or a substrate having polysilicon formed as the third layer on a single crystal silicon substrate through an insulation layer be used.

According to a yet further aspect, there is provided a production method of an acceleration sensor chip of the following processes.

Specifically, the production method of the acceleration sensor chip is characterized by comprising:
(a) a step for preparing a SOI wafer comprising a silicon substrate, a $SiO_2$ layer and a silicon thin film;
(b) a step for ion implanting a dopant at a position corresponding to a semiconductor strain gauge of the silicon thin film to form a diffusion resistor, and forming devices necessary for circuit construction on the silicon thin film;

(c) a step for providing a protective film on the entire surface of the wafer, opening a through hole penetrating the silicon thin film by patterning and etching, and forming a weight part and a beam part connecting to a support frame part remained on the periphery;

(d) while maintaining the protective film, as is, for forming the through hole, a step for removing by wet etching the SiO$_2$ layer under the weight part and the beam part;

(e) a step for removing the protective film, and coating a resist over the entire surface of the wafer;

(f) a step for forming a slit by dicing for dividing the chip while maintaining a small thickness of the wafer;

(g) a step for removing by ashing the resist on the wafer by an O$_2$ plasma; and (h) a step for dividing the chip by concentrating a stress on the slit.

According to a yet further aspect, there is provided a production method of an angular acceleration sensor chip of the following processes.

Specifically, the production method of the angular acceleration sensor chip is characterized by comprising:

(a) a step for preparing a SOI wafer comprising a silicon substrate, a SiO$_2$ layer and a silicon thin film;

(b) a step for ion implanting a dopant at a position corresponding to a semiconductor strain gauge of the silicon thin film to form a diffusion resistor, forming a magnetic thin film at a position corresponding to a weight part, forming a detection coil surrounding the magnetic thin film, and forming devices necessary for circuit construction on the silicon thin film;

(c) a step for providing a protective film on the entire surface of the wafer, opening a through hole penetrating the silicon thin film by patterning and etching, and forming a beam part connecting to the weight part and a support frame part remained on the periphery;

(d) while maintaining the protective film, as is, for forming the through hole, a step for removing by wet etching the SiO$_2$ layer under the weight part and the beam part;

(e) a step for removing the protective film, and coating a resist over the entire surface of the wafer;

(f) a step for forming a slit by dicing for dividing the chip while maintaining a small thickness of the wafer;

(g) a step for removing by ashing the resist on the wafer by an O$_2$ plasma; and (h) a step for dividing the chip by concentrating a stress on the slit.

According to a yet further aspect, there is provided a production method of an acceleration sensor chip of the following processes.

Specifically, the production method of the acceleration sensor chip for constructing a sensor structure on a third layer provided on a first layer of support substrate through an insulating second layer, characterized by comprising:

a first step for forming a plurality of cutouts of a same width on the third layer to form a detection surface of the sensor structure having a beam part and a weight part for displacing the beam part which are separated from each other;

a second step for filling the plurality of cutouts of the same width of the sensor structure with a sealing agent to flatten the surface of the third layer including the sensor structure;

a third step for forming a circuit part connected electrically to the sensor structure in the periphery of the surface-flattened third layer; and a fourth step for removing the sealing agent filled in the plurality of cutouts of the same width and removing the second layer located beneath a detection surface of the sensor structure to make the beam part and the weight part provided on the detection surface of the sensor structure displaceable.

The above acceleration sensor chip production method may further have a fifth step for coating a protective film on the surface of the third layer including the sensor structure after the fourth step, forming a slit in the protective film-coated third layer, and performing dicing, and a sixth step for removing the protective film of the third layer after dicing.

Further, in any one of the first step to the fourth step of the acceleration sensor chip production method, a film with a smaller thermal expansion coefficient than the material of the first layer may be formed on the backside of the first layer.

Further, in the above acceleration sensor chip production method, the same width of the plurality of cutouts formed on the sensor structure may be a width of 2 $\mu$m or less.

Still further, in the above acceleration sensor chip production method, as a substrate comprising the first layer, the second layer and the third layer, a silicon-on-insulator structure substrate may be used, or a substrate having polysilicon formed as the third layer on a single crystal silicon substrate through an insulation layer be used.

In accordance with the present invention, which attains the second object, there is provided a semiconductor sensor comprising a semiconductor sensor chip for detecting a physical value applied in a direction perpendicular to the surface of the chip and a package for incorporating the semiconductor sensor chip. In the package, a main surface for mounting the semiconductor sensor chip is formed to have a predetermined angle with respect to the surface of a printed circuit board for mounting the package, the main surface is provided with a plurality of terminals along two opposite sides thereof for connecting with input/output terminals of the semiconductor sensor chip, a bottom surface perpendicular to the main surface is provided with a plurality of pins respectively formed along the two sides parallel to the main surface, which plurality of pins are inserted into mounting holes formed in the printed circuit board, the plurality of terminals and the plurality of pins are electrically connected, and the input/output terminals of the semiconductor sensor chip mounted on the main surface are electrically connected with the plurality of terminals of the package.

In this case, the main surface for mounting the semiconductor chip is formed substantially perpendicular to the surface of the printed circuit board for mounting the package.

The semiconductor sensor chip may be a semiconductor acceleration sensor chip.

The semiconductor acceleration sensor chip may be any one of the above described acceleration sensor chips used to attain the first object.

Also, the semiconductor acceleration sensor chip may be the above described angular acceleration sensor chip used to attain the first object.

The semiconductor sensor package according to the present invention is a package for incorporating a semiconductor sensor chip characterized in that a main surface for mounting the semiconductor chip is formed at a predetermined angle with respect to the surface of a printed circuit board mounting the package, the main surface is provided with a plurality of terminals along two opposite sides thereof for connecting with input/output terminals of the semiconductor sensor chip, a bottom surface perpendicular to the main surface is provided with a plurality of pins respectively formed along the two sides parallel to the main surface, which plurality of pins are inserted into mounting holes formed on the printed circuit board, and the plurality of terminals and the plurality of pins are electrically connected along two side surfaces sandwiching the main surface.

Here, the main surface for mounting the semiconductor sensor chip can be formed substantially perpendicular to the surface of the printed circuit board mounting the package.

The wiring for connecting the plurality of terminals and the plurality of pins is preferably buried in the package.

The above and the other objects, effects, features and advantages of the present invention will become more apparent from the following description of embodiments thereof taken in conjunction with the accompanying drawings.

BRIEF DESCRIPTION OF THE DRAWINGS

FIGS. 14A to 14H are diagrams for explaining an acceleration sensor chip production method of the third embodiment;

FIG. 24A is a sectional diagram taken along line XXIVA—XXIVA of FIG. 23;

FIG. 24B is a sectional diagram taken along line XXIVB—XXIVB of FIG. 23;

FIG. 32A is a schematic diagram for explaining the semiconductor sensor according to the present invention, showing a front diagram of the sensor with the cover removed;

FIG. 32B is a schematic side diagram of the semiconductor sensor;

FIG. 32C is a sectional diagram taken along line XXXIIC—XXXIIC of FIG. 32A;

FIG. 32D is a sectional diagram taken along line XXXIID—XXXIID of FIG. 32A;

DETAILED DESCRIPTION OF THE INVENTION

In the present invention, a SOI (silicon-on-insulator) wafer is used for the acceleration sensor chip. While several methods are known in the art for SOI wafer formation, for example a recrystallization method, an epitaxial growth method (SOS and the like), an insulation layer embedding method (SIMOX and the like), and a lamination method, a SOI wafer advantageously applicable to the present invention is formed by a direct joining technology utilizing an oxide film. Specifically, the surface of a 500 to 700 μm thick first silicon substrate (support substrate) is polished to a mirror surface, a several μm thick oxide film is formed on the surface of a second silicon substrate (movable part formation substrate) of the same diameter, these two substrates are put together, and closely contacted substrates are heated in an oxidizing atmosphere to join the two substrates with each other. Then, the second substrate is ground and precision mirror polished to remove an oxide film of the surface opposing the bonded surface and reduce the thickness of the second substrate to a predetermined value, for example, 5 to 10 μm, thereby obtaining a desired SOI wafer.

On the thus obtained SOI wafer, a number of acceleration sensor chips are collectively formed. Specifically, first, a sensor part having formed thereon a movable part comprising a weight part and a beam part, a support frame part for supporting both parts, and a semiconductor strain gauge, an amplifier circuit, a digital adjustment circuit, wiring, input/output terminals, and the like are formed on the second silicon substrate. Next, an insulation layer (sacrificial oxide film) under the movable part is removed by etching. Then, the wafer can be diced into discrete chips to fabricate a number of acceleration sensor chips.

In the acceleration sensor chip according to the present invention, the thin-walled movable part is formed on the second silicon substrate on the thick-walled first silicon substrate, there is no problem with strength due to the use of a large-diameter wafer. In particular, since the sensor part is small in size, has a resonant point at a high frequency of about 40 to 80 kHz, and a wafer of 500 to 700 μm in thickness is used as the first silicon substrate, an excessive displacement or stress will never be applied to the thin beam part due to a resonance of the wafer itself. Therefore, a number of sensor chips can be collectively fabricated using a large-diameter wafer of 5, 6, or 8 inches in diameter.

EMBODIMENT 1

Figure 4:
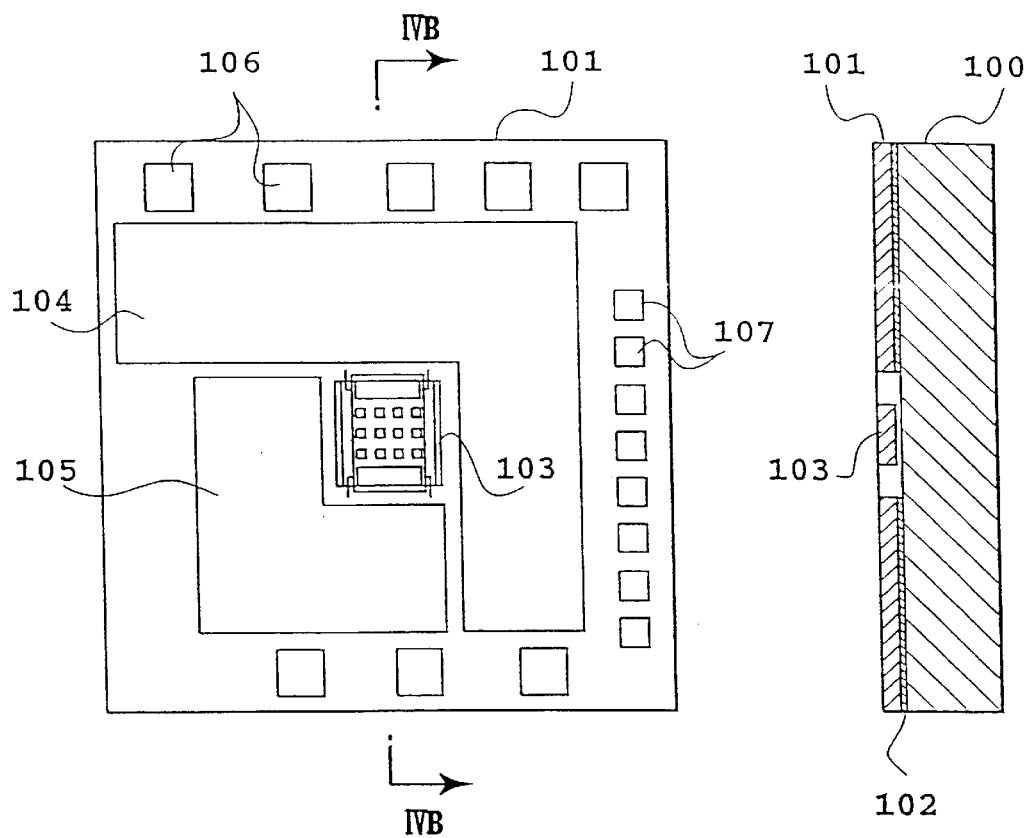
FIG. 4A is a schematic plane diagram showing the structure of a first embodiment of the acceleration sensor chip according to the present invention.
FIG. 4B is a schematic sectional diagram taken along line IVB—IVB of FIG. 4A.
Figure 5:
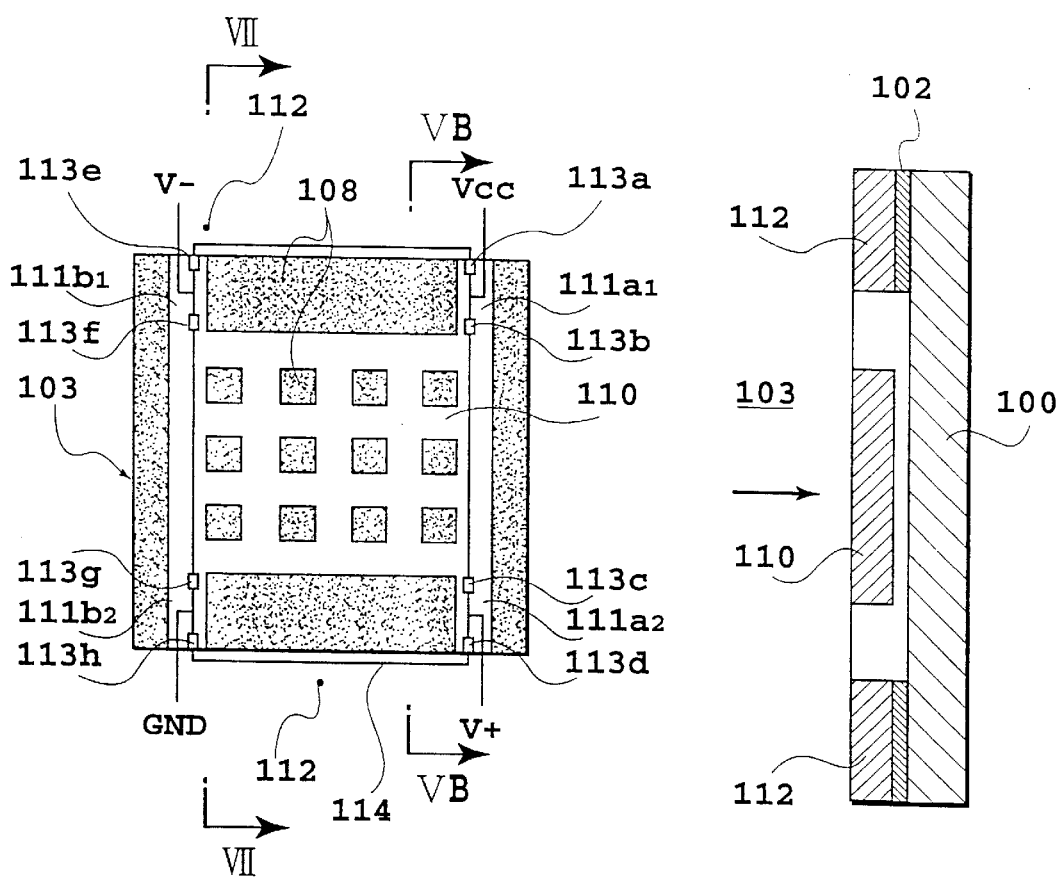
FIG. 5A is a schematic enlarged plane diagram showing a sensor part of the acceleration sensor chip shown in FIGS. 4A and 4B.
FIG. 5B is a schematic sectional diagram taken along line VB—VB of FIG. 5A.

A first embodiment of the acceleration sensor chip according to the present invention is shown in FIGS. 4A, 4B, 5A and 5B. FIG. 4A is a schematic plane diagram showing the top of the acceleration sensor chip, FIG. 4B is a sectional diagram taken along line IVB—IVB of FIG. 4A, FIG. 5A is an enlarged plane diagram of the sensor part, and FIG. 5B is a sectional diagram taken long line VB—VB of FIG. 5A.

As shown in FIG. 4A and 4B, a $SiO_2$ layer 102 to be an electrical isolation and sacrificial layer is formed between a silicon substrate 100 and a silicon thin film 101, thus forming a chip. On the silicon thin film 101 of the chip, a sensor part 103 disposed at the center of the chip, a digital adjustment circuit 104, an analog amplifier circuit 105, input/output terminals 106, and digital adjustment terminals 107 are formed. The analog amplifier circuit 105 is for amplifying an output of the sensor part 103. The digital adjustment circuit 104 is for performing sensitivity compensation and temperature compensation of the sensor chip, which is formed, for example, of a ROM. The digital adjustment terminals 107 are for inputting data for adjustment purpose to the digital adjustment circuit 104.

As shown in FIG. 5A, the sensor part 103 comprises a weight part 110, and protruded parts (beam parts) $111a_1$, $111a_2$, $111b_1$, and $111b_2$ at four corners thereof, the weight part 110 is integrated with a surrounding support frame part 112 through the protruded parts (beam parts) $111a_1$, $111a_2$, $111b_1$, and $111b_2$ at the four corners. In this structure, the weight part 110 is supported by two sets of parallel beams, that is, supported on the support frame part 112 by a first beam including the protruded parts $111a_1$ and $111a_2$ and a second beam including the protruded parts $111b_1$ and $111b_2$. Numeral 108 indicates through holes penetrating the silicon thin film 101. Utilizing these through holes, the $SiO_2$ layer 102 under the weight part 110 and the beam parts $111a_1$, $111a_2$, $111b_1$, and $111b_2$ is removed by wet etching (see FIG. 4B and FIG. 5B). As a result, the weight part 110 and the first and second beams are displaceable in a direction perpendicular to the surface thereof.

The weight part 110 and the beam parts $111a_1$, $111a_2$, $111b_1$, and $111b_2$ are equal in thickness, which is, for example, 5 μm. Dimensions of the weight part 110 are, for example, 850 μm×600 μm, and width of the beam parts is, for example, 30 μm. At respective support frame sides and weight part sides on ends of the beam parts $111a_1$, $111a_2$, $111b_1$, and $111b_2$, a total of 8 semiconductor strain gauges 113a, 113b, 113c, 113d, 113e, 113f, 113g, and 113h are formed by dopant diffusion. Wiring 114 connects these strain gauges, and a Wheatstone bridge is formed of the strain gauges. The Wheatstone bridge is connected to a constant voltage power supply Vcc and a ground GND, and the outputs V+ and V− thereof are conducted to the amplifier circuit 105.

Figure 6:
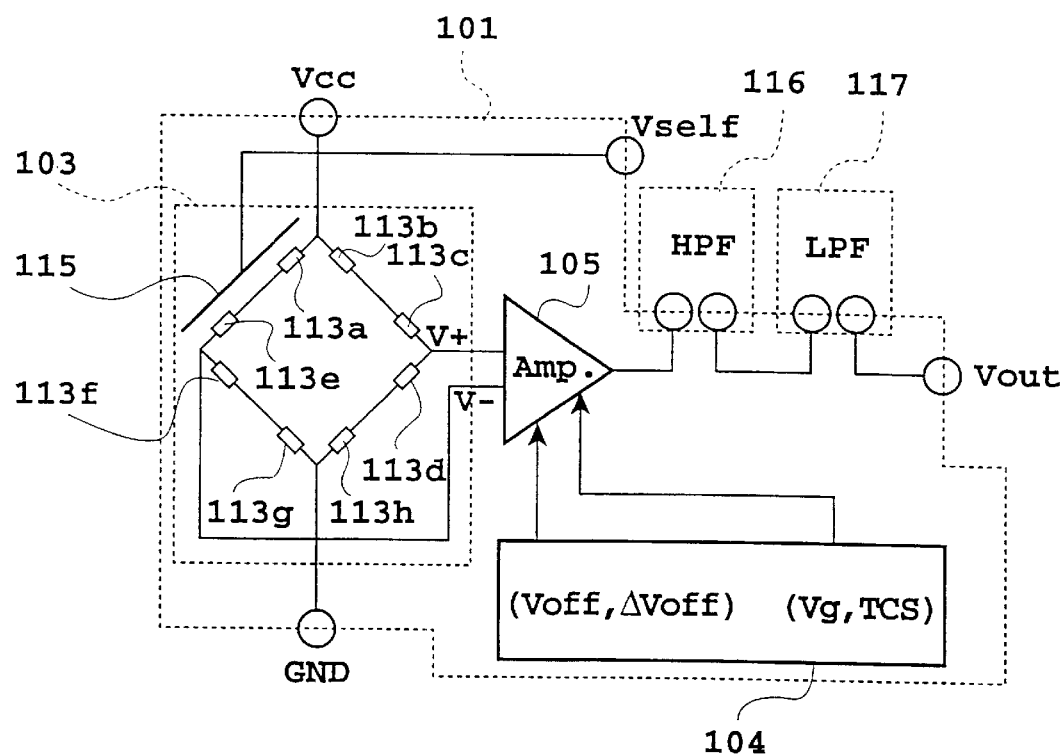
FIG. 6 is a block diagram of an acceleration detection circuit in the acceleration sensor chip of the first embodiment.

FIG. 6 shows a block diagram of an acceleration detection circuit. Outputs V+ and V− of the Wheatstone bridge composed of the eight semiconductor strain gauges 113a, 113b, 113c, 113d, 113e, 113f, 113g, and 113h are inputted and amplified in the amplifier circuit 105. When an acceleration is applied in a direction of the arrow in FIG. 5B, the strain gauges 113b, 113c, 113f, and 113g at the weight part side are subjected to a compressive stress to decrease their resistance, and the support frame part side strain gauges 113a, 113d, 113e, and 113h are subjected to a tensile stress to increase their resistance. As a result, a sensor output according to the magnitude of the acceleration is obtained from the Wheatstone bridge, which is amplified by the amplifier circuit 105. Further, data Vg for sensitivity compensation, a data TCS and an offset voltage Voff (sensor output when no acceleration is applied) for compensating the temperature characteristic of sensitivity, and a data ΔVoff for compensating a deviation of the offset voltage are input from the digital adjustment circuit 104 to the amplifier circuit 105. Output of the amplifier circuit 105 is obtained as an output Vout through a high-pass filter 116 and a low-pass filter 117. Thus, a detection result which is compensated as necessary is delivered as the bridge output voltage Vout. The high-pass filter 116 and the low-pass filter 117 may be external circuits, or adjustment parts of frequency response areas thereof may be incorporated in the digital adjustment circuit 104.

Figure 1A:
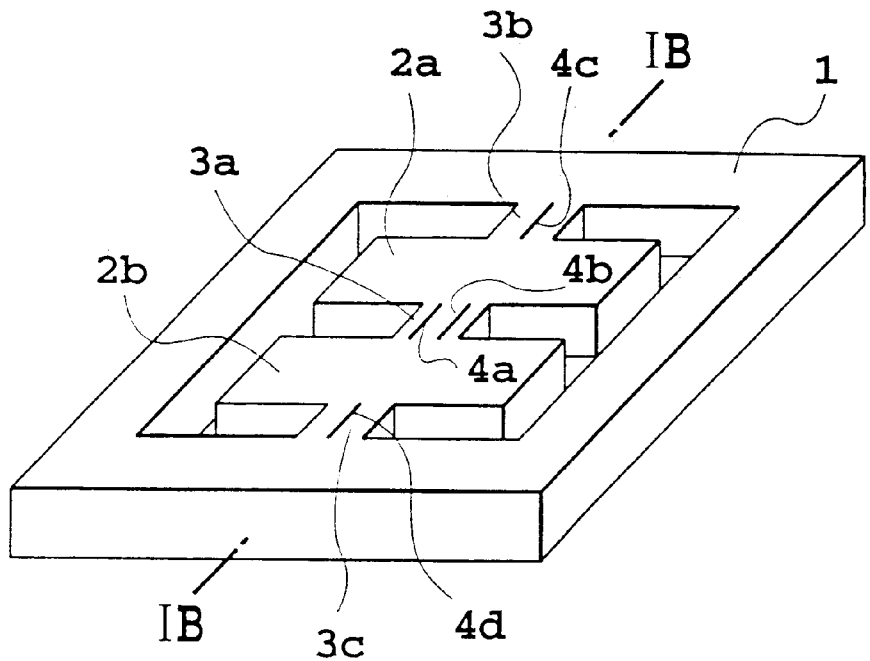
FIG. 1A is a schematic perspective diagram showing a first example of a prior art acceleration sensor chip.
Figure 1B:
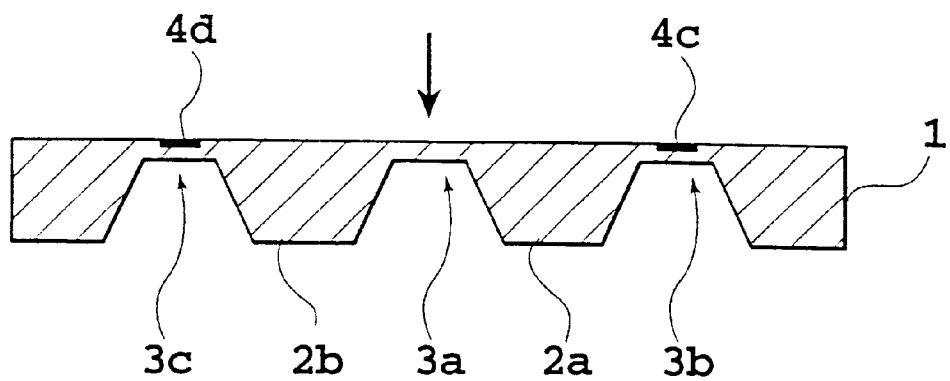
FIG. 1B is a schematic sectional diagram taken along line IB—IB of FIG. 1A.

In the present embodiment, the weight part 110 is movably supported on the support frame part 112 by the two parallel beam parts 111a and 111b formed on both sides. This prevents a measurement error due to a torsional deformation of the beam parts which can occur in a prior art acceleration sensor chip shown in FIGS. 1A and 1B. Further, in the present embodiment, since two strain gauges are disposed on one side of the bridge, sensitivity of the sensor chip can be enhanced. Still further, in the present invention, since the Wheatstone bridge is formed of semiconductor strain gauges, even if foreign matter of a size that does not disturb the movement of the weight part enters between the sensor part 103 and the silicon substrate 100, the influence on the sensor characteristic is small, unlike the capacitive type.

Yet further, the acceleration sensor chip of the present embodiment is provided with a function to confirm whether or not the sensor performance is normal, that is, a self-check function. This is performed as follows. Silicon of small resistivity is used as the silicon substrate 100, an electrode 115 provided on the backside (in FIG. 6, it is shown to be on the surface for convenience) is applied externally with a voltage Vself to generate a potential difference between the silicon substrate 100 and the silicon thin film 101, the sensor 103 is displaced by the electrostatic force, and an output from the bridge is detected. The gap between the silicon substrate 100 and the silicon thin film 101 is determined by the thickness of the SiO$_2$ layer in between. In other words, the gap size can be easily controlled by controlling the thickness of SiO$_2$ layer in the production of the SOI wafer. Therefore, since the magnitude of the electrostatic force generated by an applied voltage can be easily and precisely calculated, self diagnosis (self-check) is possible by checking the relationship between the magnitude of an AC or DC voltage applied to the electrode 115 and the sensor output. Naturally, since dimensions of the movable part comprising the weight part and the beam parts are determined at the time of designing, a voltage range for generating a displacement that does not cause contact with the silicon substrate can be easily determined.

Next, a production method of the above-described embodiment will be described with reference to FIGS. 7A to 7H. FIGS. 7A to 7H show cross-sections along line VII—VII of FIG. 5A.

Figure 7A:
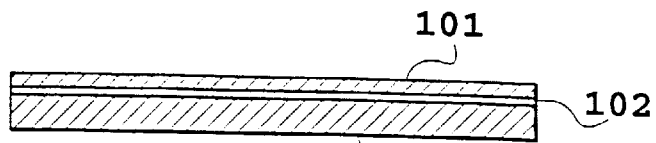
FIGS. 7A to 7H are diagrams for explaining a production method of the acceleration sensor chip of the first embodiment.

As shown in FIG. 7A, a SOI wafer is prepared, which comprises the silicon substrate 100 produced by the above-described direct joining method, the SiO$_2$ layer 102, and the silicon thin film 101. In the present embodiment, a 6-inch diameter wafer is used, the silicon substrate 100, the SiO$_2$ layer 102, and the silicon thin film 101 have thicknesses of 625 μm, 1 μm, and 5 μm, respectively. In this state, boron or phosphorus is ion implanted at positions corresponding to semiconductor strain gauges 113a to 113h of the silicon thin film 101 to form diffusion resistors. The digital adjustment circuit 104, the analog amplifier circuit 105, the terminals 106 and 107, wiring and other devices necessary for circuit construction are formed in this stage on the silicon thin film 101.

Figure 7B:
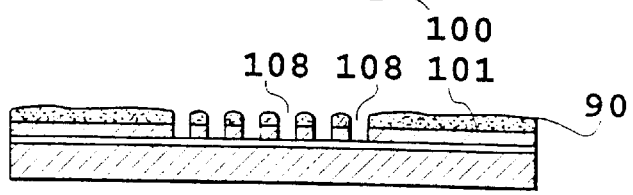

As shown in FIG. 7B, a protective film 90 is provided on the entire surface of the wafer, the through holes 108 penetrating the silicon thin film 101 are opened by patterning and etching (wet or dry etching) to form the weight part and the beam parts connecting the support frame part remaining on the periphery. At this time, the through holes 108 are also formed in the weight part.

Figure 7C:
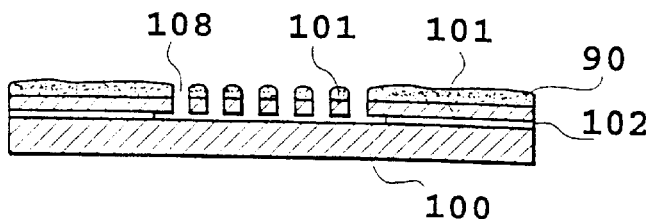

As shown in FIG. 7C, the protective film 90 for forming the through holes 108 remains, as is, the SiO$_2$ layer 102 under the weight part and beam parts is removed by wet etching using buffered hydrofluoric acid (HF+NH$_4$F)

Figure 7D:
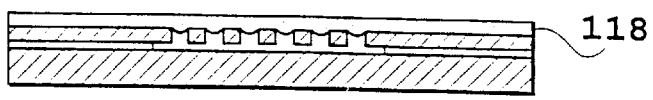

As shown in FIG. 7D, the protective film is removed, and a resist 118 is coated again on the entire wafer surface using a spinner. This resist is to protect the sensor part and circuits in the subsequent dicing process, and also to prevent foreign matters from entering the gap formed between the sensor part and the silicon substrate.

Figure 7E:
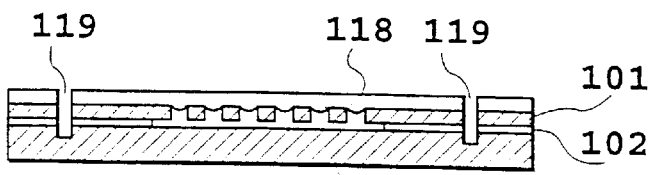

As shown in FIG. 7E, by dicing, slits 119 for dividing the chip are formed while remaining a small thickness of the wafer.

Figure 7F:
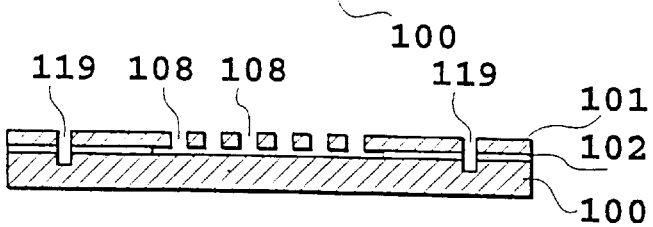

As shown in FIG. 7F, the resist on the wafer is removed by washing using an O$_2$ plasma.

Figure 7G:
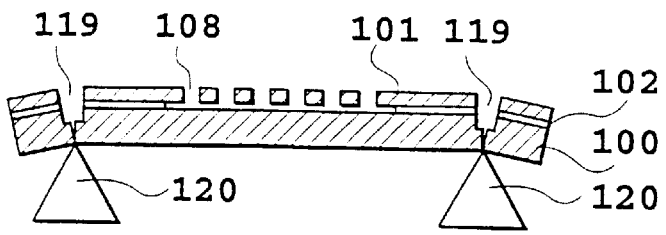

As shown in FIG. 7G, the chip is divided using a tool 120 for concentrating a stress on the slits 119.

Figure 7H:
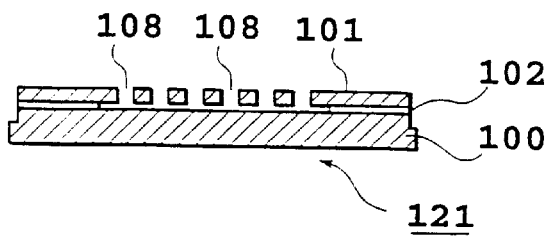

As a result, as shown in FIG. 7H, a divided chip 121 is completed.

Thus, a number of acceleration sensor chips can be collectively produced from a large diameter wafer, and foreign matter can be prevented from entering the gap between the silicon substrate and the movable part of the sensor during the production process.

EMBODIMENT 2

Figure 8A:
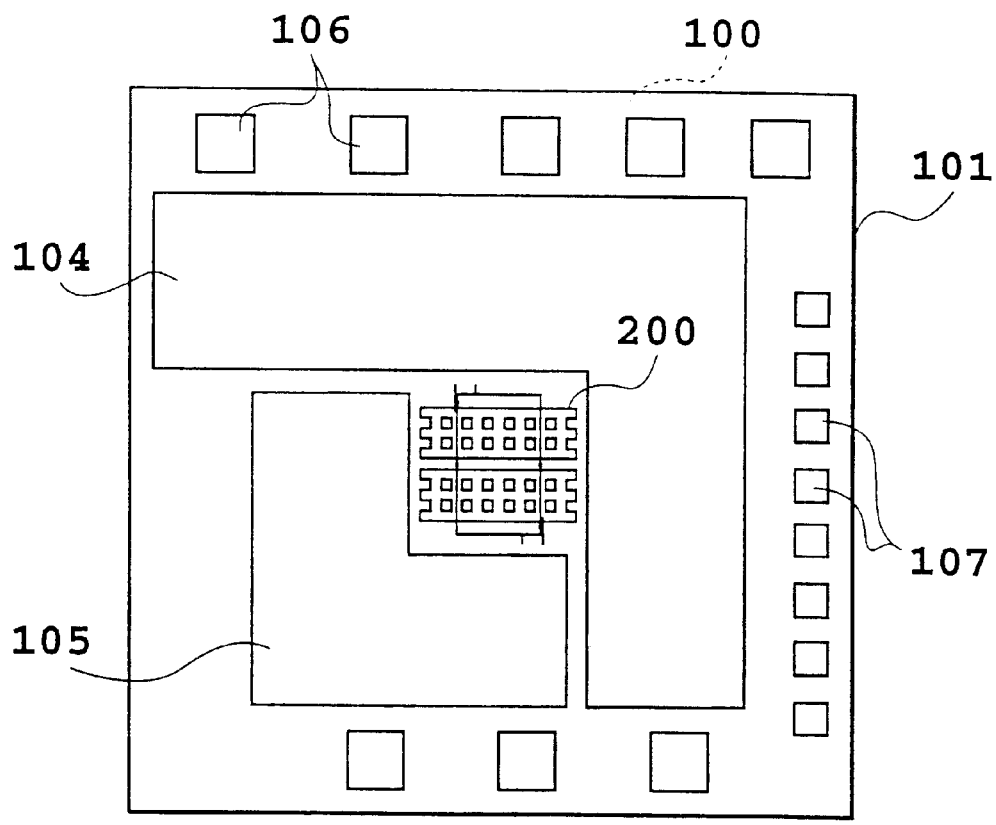
FIG. 8A is a schematic plane diagram showing the structure of a second embodiment of the acceleration sensor chip according to the present invention.
Figure 8B:
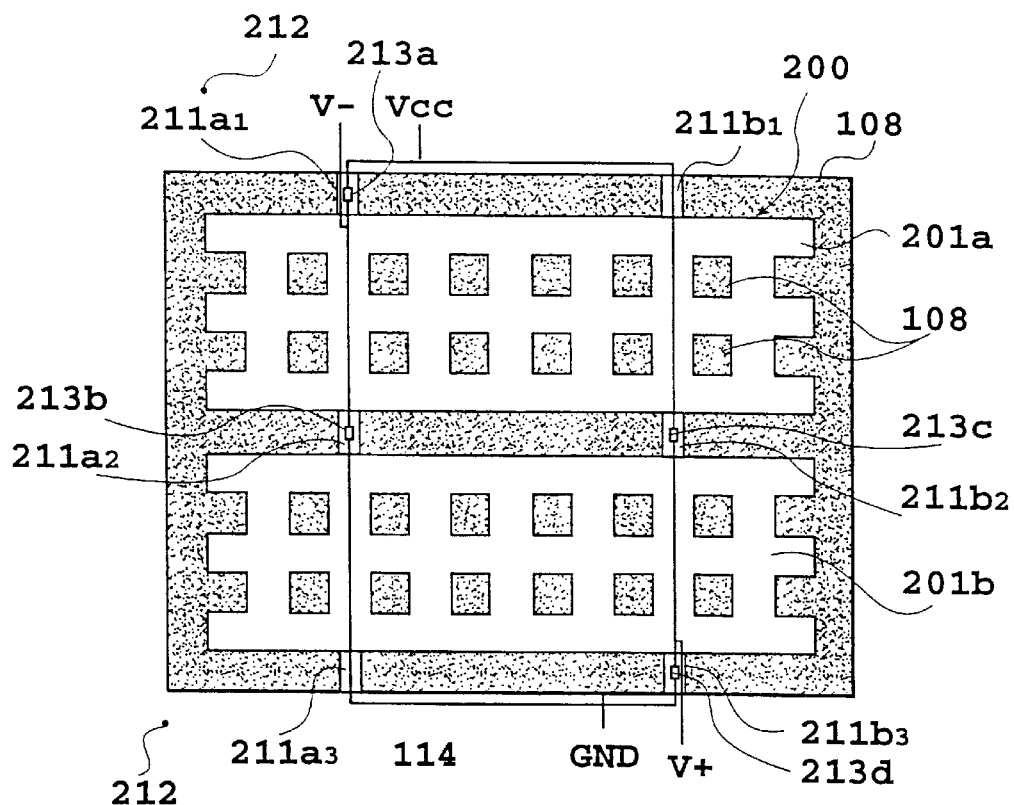
FIG. 8B is a schematic enlarged plane diagram showing a sensor part of the acceleration sensor chip shown in FIG. 8A.

A second embodiment of the acceleration sensor chip according to the present invention is shown in FIGS. 8A, and 8B. FIG. 8A is a top diagram, and FIG. 8B is an enlarged diagram of the sensor part.

As shown in FIG. 8A, a chip is constructed in a manner similar to that shown in FIGS. 4A and 4B. On the silicon thin film 101 of the chip, a sensor part 200 disposed at the center of the chip, a digital adjustment circuit 104, an analog amplifier circuit 105, input/output terminals 106 and digital adjustment terminals 107 are formed. The present embodiment differs from the first embodiment in the structure of the sensor part and the layout of semiconductor strain gauges in association with the sensor part structure. Since other parts are the same as the first embodiment, detailed description thereof is omitted.

As shown in FIG. 8B, the sensor part 200 comprises two weight parts 201a and 201b, and six connection parts 211$a_1$, 211$a_2$, 211$a_3$, 211$b_1$, 211$b_2$, and 211$b_3$ for connecting a support frame part 212 and for connecting the two weight parts and a support frame part 212 and for connecting the two weight parts with each other. The two weight parts and the periphery thereof are provided with the through holes as in the weight part of the embodiment 1, and the SiO$_2$ layer under the two weight parts and the six connection parts is removed by etching. Therefore, the two weight parts are integrated with the peripheral support frame part 212 through the connection parts 211$a_1$, 211$a_3$, 211$b_1$, and 211$b_3$, thus being displaceable in a direction perpendicular to the paper surface. In this structure, the two weight parts 201a and 201b are supported on the support frame part 212 by two parallel beams, that is, a first beam including the connection parts 211$a_1$, 211$a_2$, and 211$a_3$, and a second beam including the connection parts 211$b_1$, 211$b_2$, and 211$b_3$.

Semiconductor strain gauges 213a, 213b, 213c, and 213d are formed by dopant diffusion on the connection parts $211a_1$ and $211a_2$ of the first beam, and on the connection parts $211b_2$ and $211b_3$ of the second beam, respectively. To increase the sensitivity, thickness of the beam is preferably smaller than the thickness of the weight part (thickness of the silicon thin film). In the present embodiment, the beam has a thickness of 2 $\mu$m while the weight part has a thickness of 5 $\mu$m.

The acceleration sensor chip of the present embodiment can be produced by the same process as in the first embodiment. However, to reduce the thickness of the beam, in the above process (a), before forming the semiconductor strain gauges, circuit devices and the like, the thickness of the beam is decreased by way of pattern etching.

Figure 9:
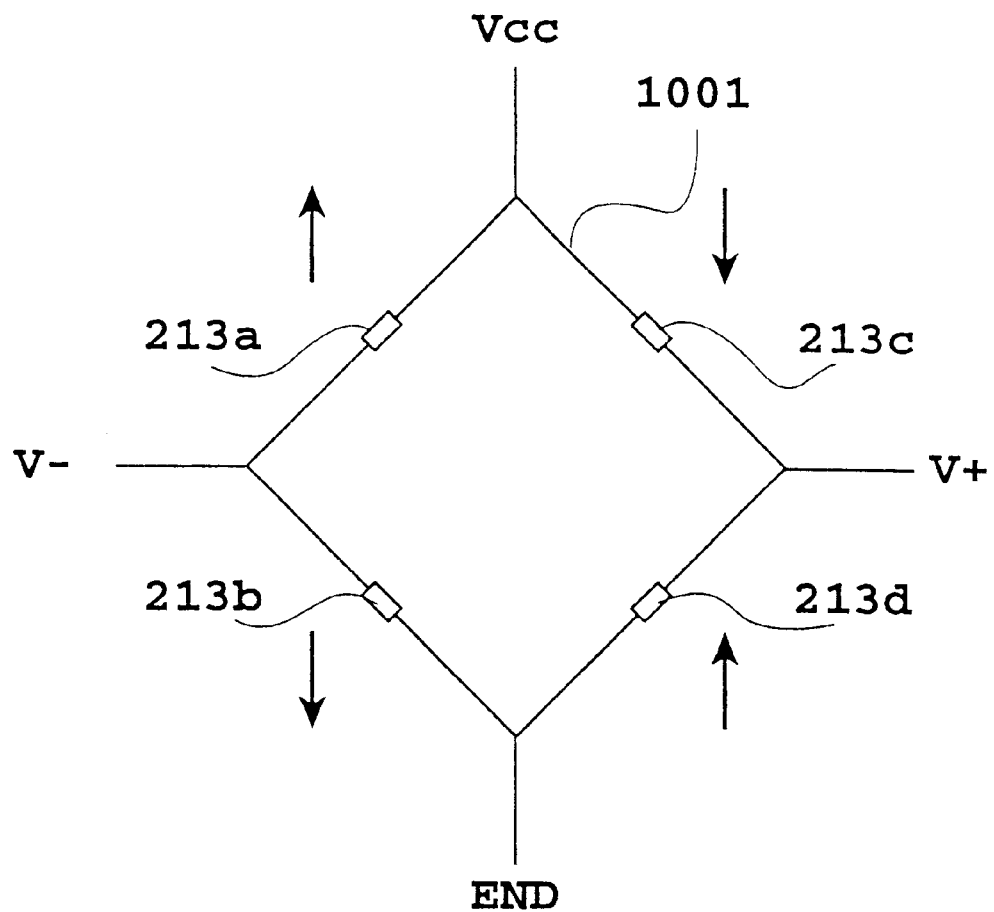
FIG. 9 is a circuit diagram showing a Wheatstone bridge circuit in the acceleration sensor chip of the second embodiment.

FIG. 9 shows the Wheatstone bridge circuit in the present embodiment. When an acceleration in a direction towards the silicon substrate is applied in the thickness direction of the weight part of the acceleration sensor chip shown in FIG. 8B, to the part where the semiconductor strain gauges 213b and 213c are formed in the connection parts, a compressive stress is applied, and to the part where the semiconductor gauges 213a and 213d are formed, a tensile stress is applied. Therefore, the semiconductor strain gauges 213b and 213c are decreased in resistance, and the semiconductor strain gauges 213a and 213d are increased in resistance. With these actions, a voltage change according to the acceleration change is output from the Wheatstone bridge circuit.

Figure 10:
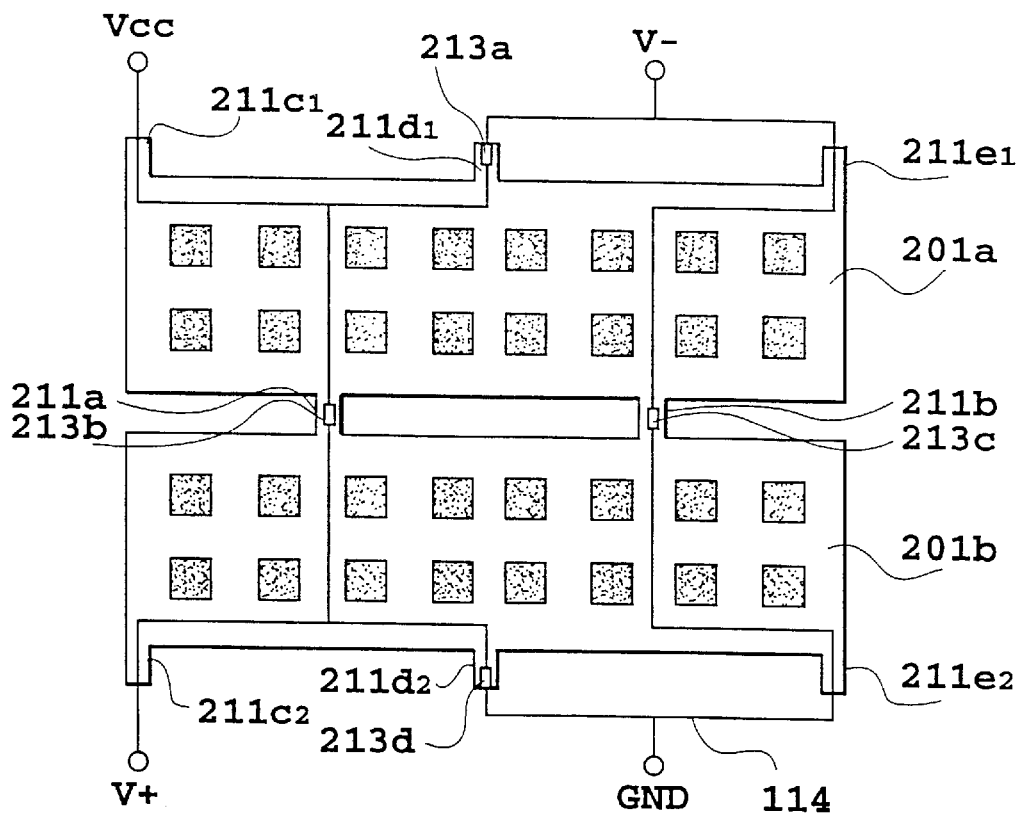
FIG. 10 is a schematic plane diagram showing another structural example of the sensor part of the acceleration sensor chip shown in FIG. 8A.

FIG. 10 shows another example of construction of the sensor part having two weight parts. Unlike the sensor part shown in FIG. 8B, the weight parts 201a and 201b are connected to the support frame part by three sets of parallel beams defined by beam parts $211c_1$ and $211c_2$, $211d_1$ and $211d_2$, $211e_1$ and $211e_2$. The weight parts 201a and 201b are, as in the example of FIG. 8B, connected by two parallel beam parts 211a and 211b. The beam parts $211d_1$, 211a, 211b and $211d_2$ are provided with semiconductor strain gauges 213a, 213b, 213c, and 213d, thereby forming a Wheatstone bridge. Since a stress is generated on the surface of the beam part by an acceleration, to increase the stability of wiring, as wiring for connecting the respective strain gauges, a normal Al wiring structure (Al wiring is provided on silicon through an insulation layer) is not used, but a diffusion wiring may be used. In this case, the diffusion wiring is a sheet resistor, and the value is determined by the length and width. In the example shown in FIGS. 8A and 8B, in the part where a strain gauges are formed of beam part connecting the weight part and the support frame part, two wirings are necessary on a single beam part, therefore the wiring becomes small in width, the sheet resistor increases in resistance, and the sensitivity is reduced to this extent. On the other hand, in an example in FIG. 10, a single wiring is sufficient for each beam, therefore the wiring width can be widened, and a low resistance wiring can be used, thereby reducing the decrease of sensitivity.

Further, since the present embodiment is constructed by such a Wheatstone bridge, any combination may be used which provides the equivalent gauge change, therefore the present embodiment is not limited to the gauge layout and gauge combination shown in FIGS. 8A, 8B, and FIGS. 9, 10.

EMBODIMENT 3

Figure 11:
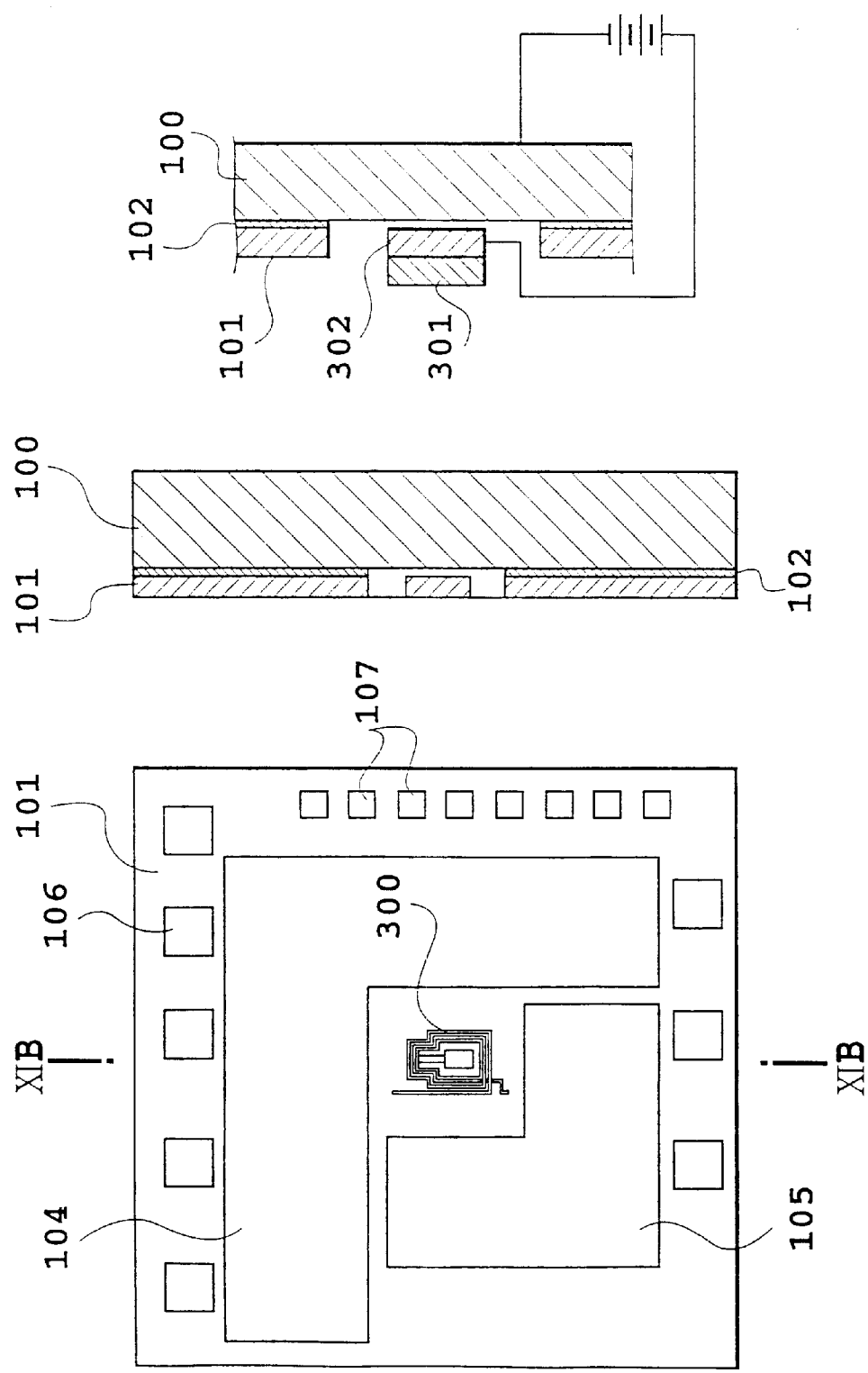
FIG. 11A is a schematic plane diagram showing the structure of a third embodiment of the acceleration sensor chip according to the present invention.
FIG. 11B is a schematic sectional diagram taken along line XIB—XIB of FIG. 11A.
FIG. 11C is a schematic enlarged diagram showing part of FIG. 11B.

A third embodiment of the acceleration sensor chip according to the present invention is shown in FIGS. 11A, 11B, and 11C. FIG. 11A is a plane diagram of the top of the sensor, FIG. 11B is a sectional diagram taken along line XIB—XIB of FIG. 11A, and FIG. 11C is an enlarged diagram of the sensor part shown in FIG. 11B.

As in the first embodiment, a $SiO_2$ layer 102 for electrical isolation and as a sacrificial layer is formed between the silicon substrate 100 and the silicon thin film 101, thus forming a chip. On the silicon thin film 101, a sensor part 300, a digital adjustment circuit 104, an analog amplifier circuit 105, input/output terminals 106 and digital adjustment terminals 107 are formed. The $SiO_2$ layer under the sensor part 300 disposed at the center of the chip is removed by etching as in embodiments 1 and 2. As will be described later, for self-checking, the sensor part can be displaced by applying a voltage between the silicon substrate 100 and the sensor part 300.

Figure 12:
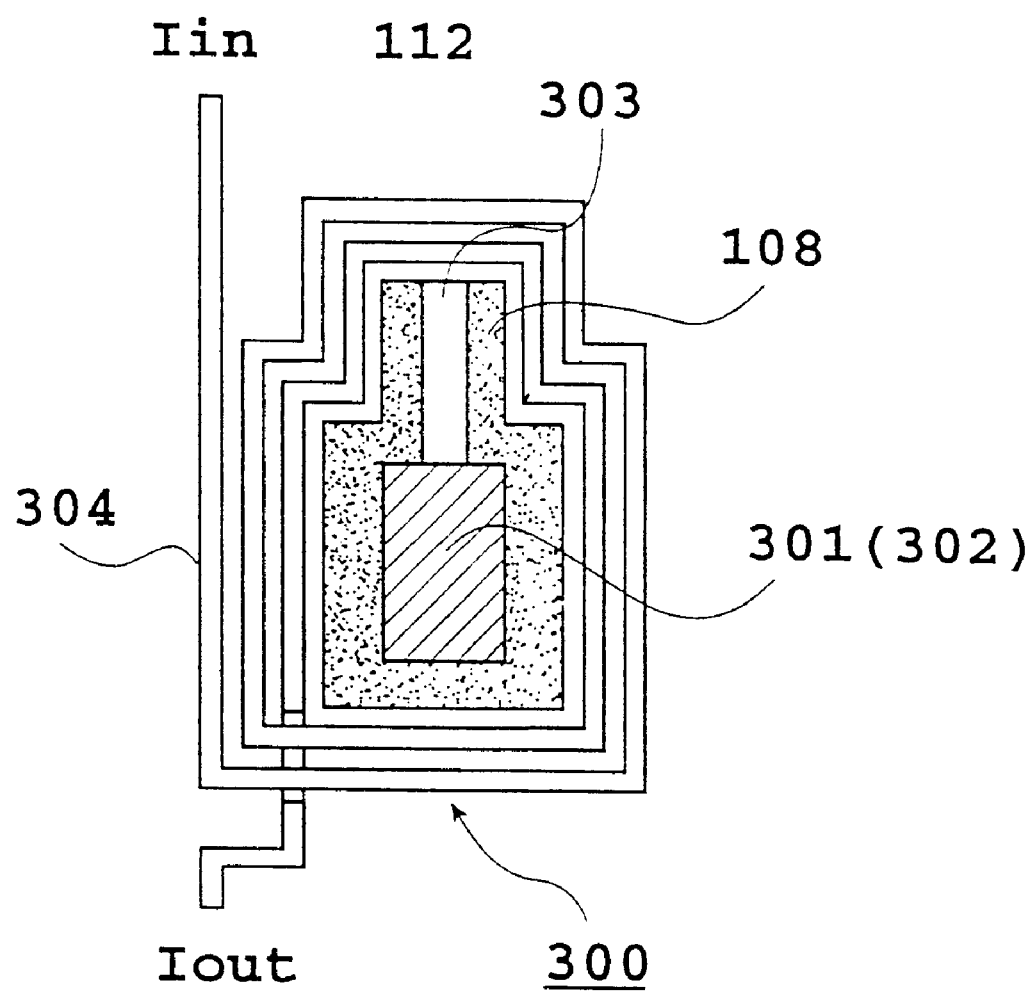
FIG. 12 is a schematic enlarged plane diagram showing a sensor part of the acceleration sensor chip shown in FIG. 11A.

An enlarged top diagram of the sensor part is shown in FIG. 12. The sensor part 300 comprises a weight part (302) on which a magnetic thin film 301 of a NbFeB type or SmCo type or the like as a thin film magnet is formed on the surface of the silicon thin film using a vacuum deposition method or sputtering method or the like, and an elastic beam part 303 for connecting the weight part and the support frame part 112. The $SiO_2$ under the sensor part is removed as described above, and the silicon thin film on the periphery of the sensor part is also removed to form a through hole for sacrificial layer etching. The weight part 302 having the magnetic thin film 301 on the surface is integrated with the support frame part through the elastic beam 303. When an acceleration perpendicular to the paper surface is applied to the weight part 302, the elastic beam 303 is deflected, and the weight part is displaced. On the support frame part at the periphery of the through hole 108, a detection coil 304 surrounding the weight part is formed using a thin film technique.

Figure 13A:
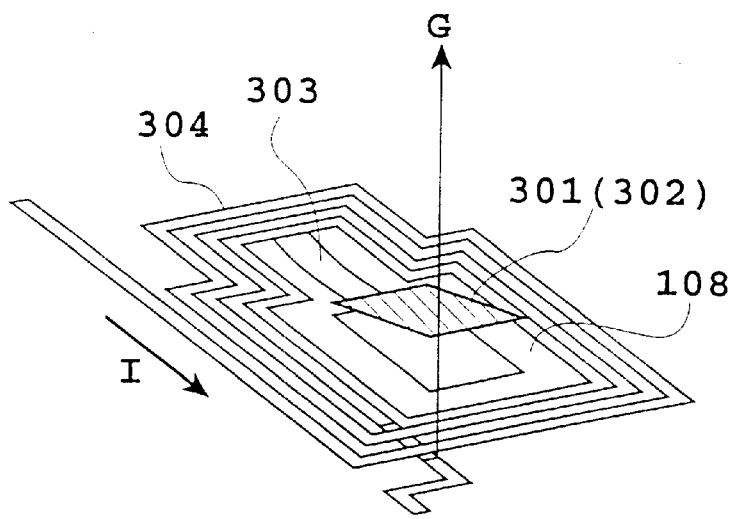
FIGS. 13A and 13B are schematic diagrams for explaining operation principle of the third embodiment.
Figure 13B:
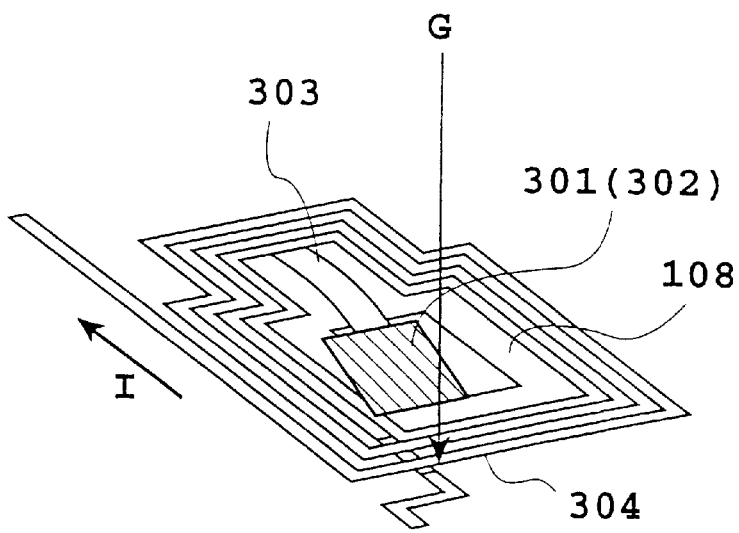

FIGS. 13A and 13B are diagrams for explaining the operation principle of the present embodiment. As shown in FIG. 13A, when an acceleration G is applied to the sensor chip, the weight part 302 and hence the magnetic thin film 301 is displaced upward, and, according to Lenz's law, a current I flows in the detection coil 304 in association with a change in acceleration of the magnetic thin film 301. On the other hand, when the magnetic thin film is displaced downward as shown in FIG. 13B, a current in the direction reverse to that shown in FIG. 13A flows in the detection coil 304. The thus generated induction current can be inputted to an integration circuit or the like to detect an acceleration, to a two-stage integration circuit to detect a velocity, and to a three-stage integration circuit to detect a displacement.

A production method of the present embodiment is shown in FIGS. 14A to 14H. FIGS. 14A to 14H are respective sectional diagrams corresponding to FIG. 11B.

Figure 14A:
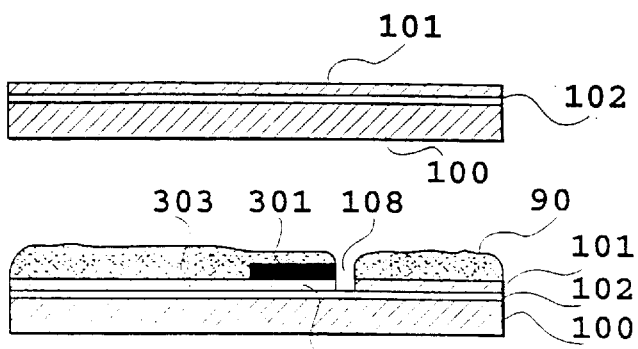

As shown in FIG. 14A, a SOI wafer is prepared, which comprises the silicon substrate 100 produced by the above-described direct joining method, the $SiO_2$ layer, and the silicon thin film 101. In this state, the magnetic thin film 301 is formed at the position corresponding to the weight part of the silicon thin film by a vacuum deposition method or a sputtering method, and a detection coil is formed on the periphery. The digital adjustment circuit 104, the analog amplifier circuit 105, the terminals 106 and 107, wiring and other devices necessary for circuit construction are formed in this stage on the silicon thin film 101.

As shown in FIG. 14B, a protective film 90 is provided on the entire surface of the wafer, the through holes 108 penetrating the silicon thin film 101 are opened by patterning and etching (wet or dry etching) to form the weight part 302 and the elastic beam part 303 connecting to the support frame part are formed.

Figure 14C:
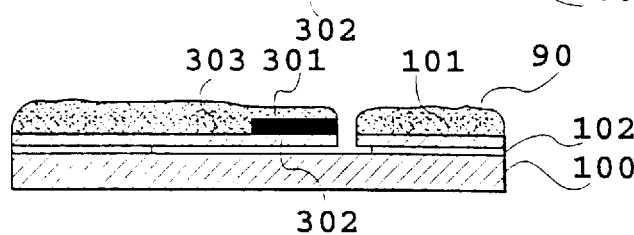

As shown in FIG. 14C, the protective film 90 for forming the through holes 108 is maintained, as is, and the SiO₂ layer 102 under the weight part and beam part is removed by wet etching using buffered hydrofluoric acid.

Figure 14D:

As shown in FIG. 14D, the protective film is removed, and a resist 118 is coated on the entire wafer surface using a spinner. This resist is to protect the sensor part and circuits in the subsequent dicing process, and also to prevent foreign matter from entering the gap formed between the sensor part and the silicon substrate.

Figure 14E:

As shown in FIG. 14E, by dicing, slits 119 for dividing the chip are formed while maintaining a small thickness of the wafer.

Figure 14F:

As shown in FIG. 14F, the resist on the wafer is removed by ashing using an O₂ plasma.

Figure 14G:
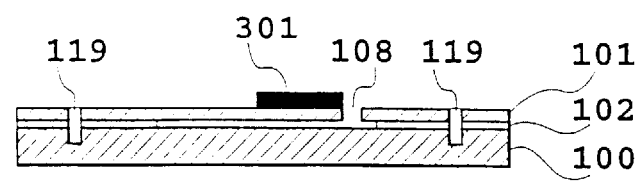

As shown in FIG. 14G, the chip is divided using a tool 120 for concentrating a stress on the slits 119.

Figure 14H:
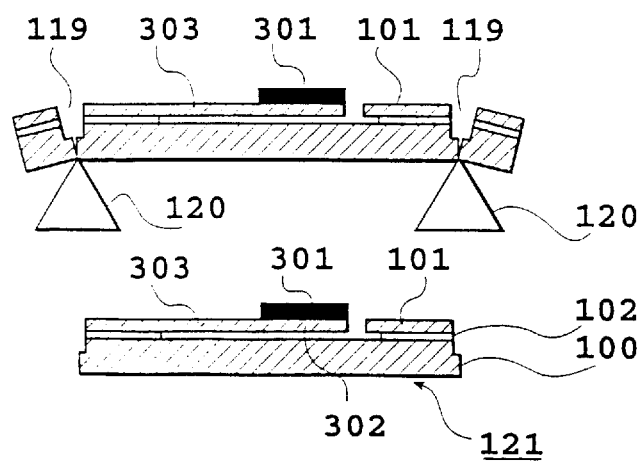

As a result, as shown in FIG. 14H, a divided chip 121 is completed.

Thus, a number of acceleration sensor chips can be collectively produced from a large diameter wafer, and foreign matter can be prevented from entering the gap between the silicon substrate and the movable part of the sensor during the production process.

Figure 15:
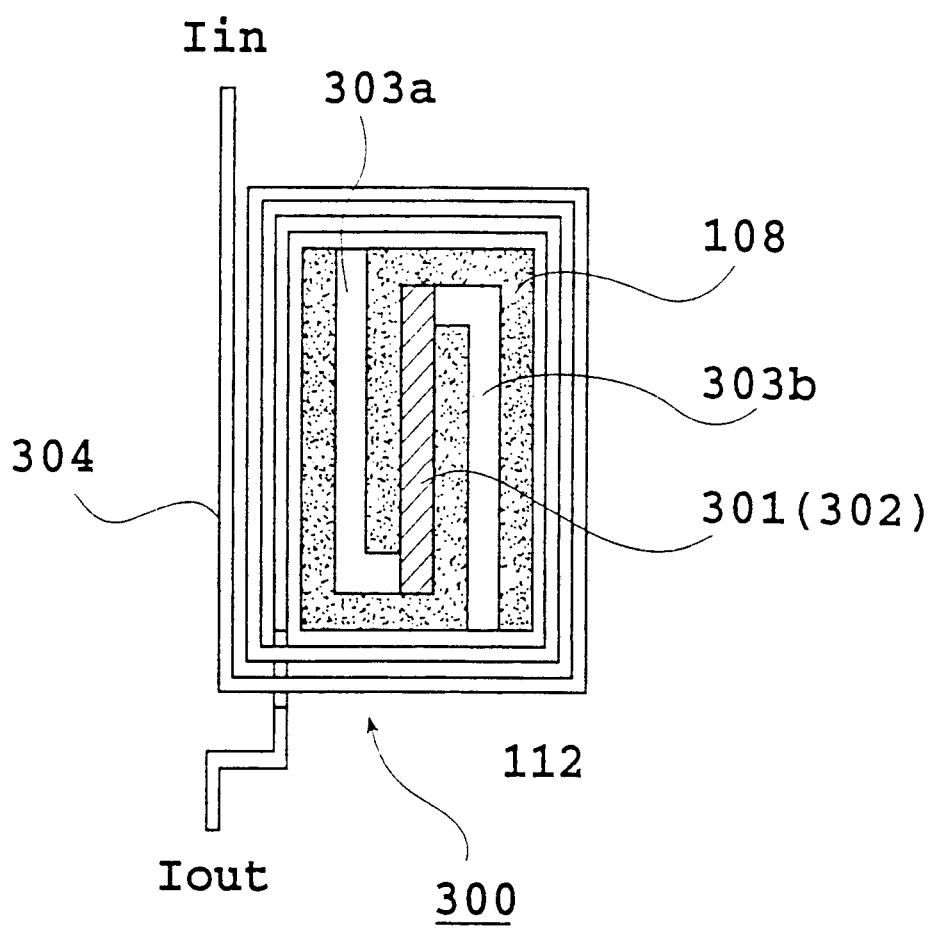
FIG. 15 is a schematic plane diagram showing another structural example of a sensor part of the acceleration sensor chip of the third embodiment.

FIG. 15 shows another construction example of the sensor part. The weight part 302 having the magnetic thin film 301 formed on the surface is supported by a plurality of elastic beams 303a and 303b. In this case, displacement of the weight part, and hence the magnetic thin film 301, is in a direction perpendicular to the paper surface.

EMBODIMENT 4

Figure 16:
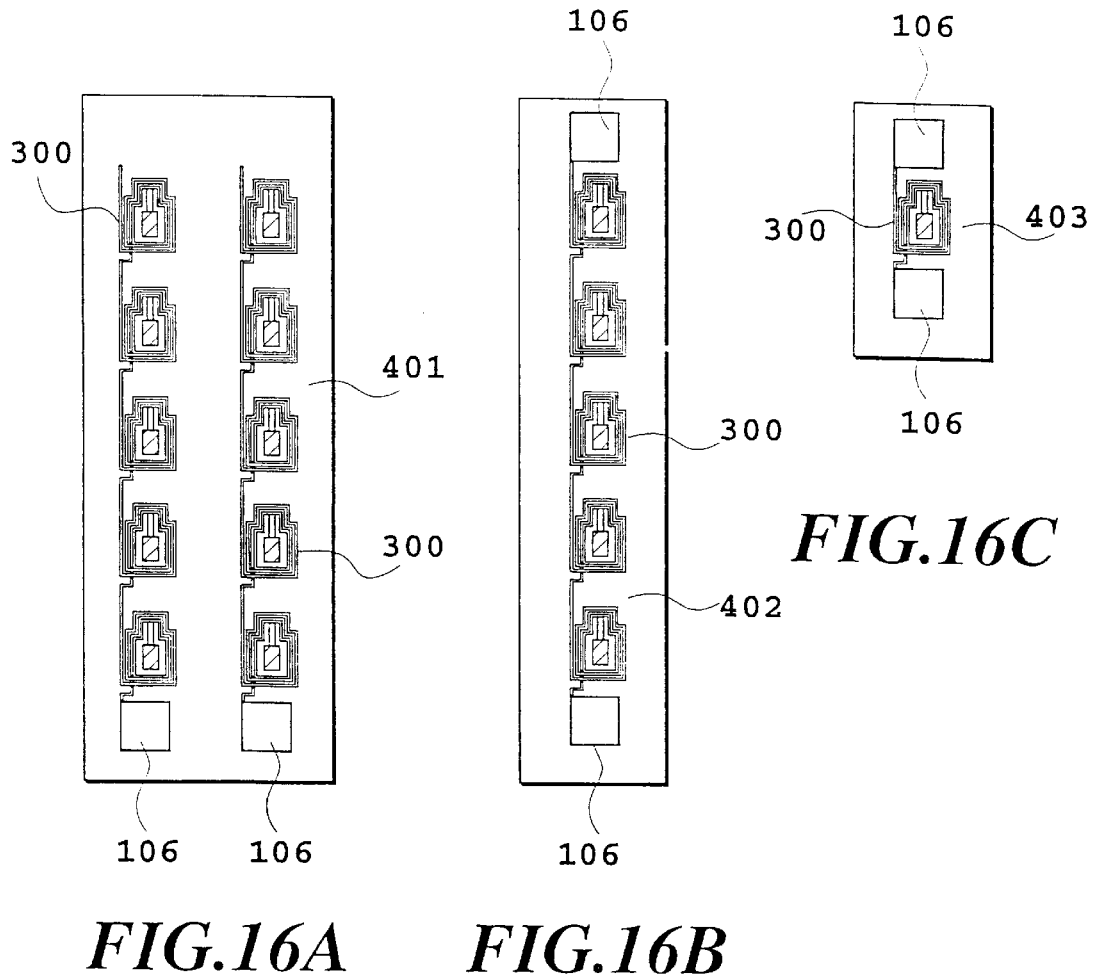
FIGS. 16A, 16B and 16C are respectively schematic plane diagrams showing the structure of a fourth embodiment of the acceleration sensor chip according to the present invention.

A fourth embodiment of the acceleration sensor chip according to the present invention is shown in FIGS. 16A, 16B, and 16C. In the present embodiment, the sensor parts of the above third embodiment are connected in series. When a signal of a single sensor is amplified, in the case of the sensor by an ordinary semiconductor strain gauge, an electrostatic capacitive type sensor chip or the like, it is generally amplified by an amplifier circuit. However, in the case of the acceleration sensor chip of the present embodiment, due to its construction, by connecting a plurality of sensors in series, it is possible to amplify the signal by providing a number of connected sensors. FIG. 16A shows a low acceleration sensor chip 401 connecting a large number of sensor parts 300, FIG. 16B shows a medium acceleration sensor chip 402 connecting a medium number of sensor parts 300, and FIG. 16C shows a high acceleration sensor chip 403 comprising a single sensor part 300. Further, when a plurality of sensors differing in detection range are formed on a single chip, and outputs of the plurality of sensors are selected and inputted to an amplifier, a single acceleration sensor chip can be used for detection of acceleration over a wide range.

Figure 17:
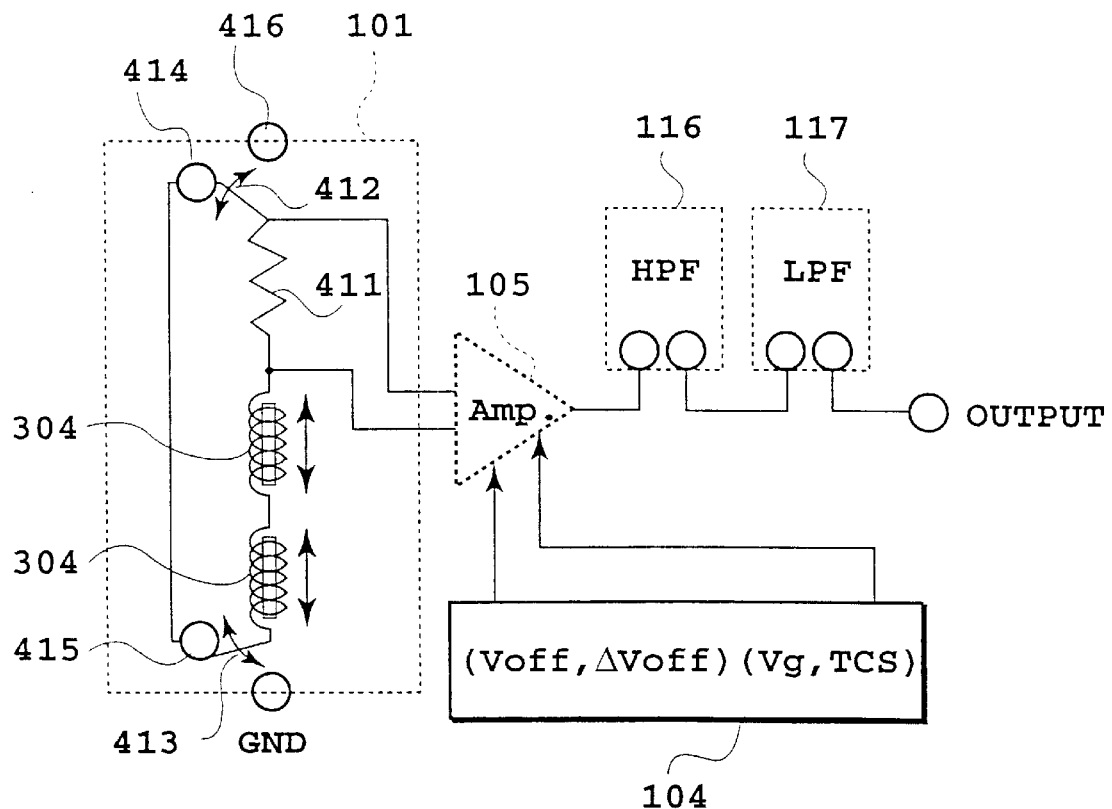
FIG. 17 is a circuit diagram showing an example of circuit structure in the acceleration sensor chip of the fourth embodiment.
Figure 18:
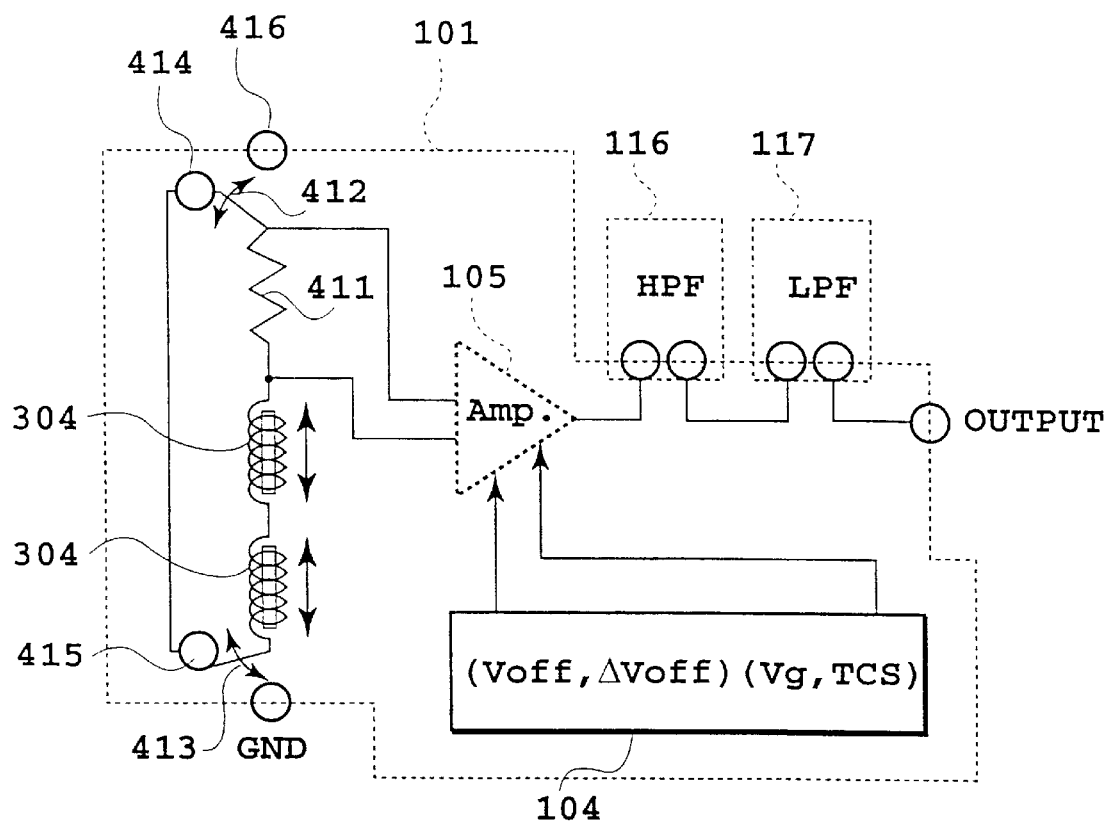
FIG. 18 is a circuit diagram showing another example of circuit construction in the acceleration sensor chip of the fourth embodiment.

A circuit construction example of the present embodiment is shown in FIGS. 17 and 18. In both figures, only two detection coils of two sensor parts are shown for simplicity. An induction current induced in the detection coil 304 of the sensor part 300 is converted to a voltage output by a voltage conversion resistor 411 and output to the outside through the amplifier circuit 105 having been adjusted by the digital adjustment circuit 104, a high-pass filter 116, a low-pass filter 117 and the like. FIG. 17 shows an example in which the digital adjustment circuit 104 and the amplifier circuit 105 are provided at a position other than on the chip on which the sensor part is formed, and FIG. 18 shows an example in which these parts are formed on the same chip as the sensor part.

In the present embodiment, as shown in FIG. 11C, self-checking is possible by which the sensor chip is moved by an electrostatic force generated when a voltage is applied between the silicon substrate 100 and the sensor part 300, and an induction current induced in the detection coil according to the movement at that time of the sensor part is amplified by the amplifier circuit 105. Further, in the present embodiment, it is also possible to perform self-checking using select switches 412 and 413 for selecting an ordinary acceleration detection and self-checking. That is, the switches are selected so that a current flows to the detection terminals 414 and 415, and to the self-check terminal 416 in self-checking. In self-checking, the detection coils 304 are supplied with a pulse output to give the sensor part 300 an impulsive electromagnetic force to move the weight part 302, a response at that time is processed and checked by the circuits after the amplifier circuit, thereby performing the self-checking. According to these methods, the self-checking function can be achieved by a simple sensor construction. Still further, in addition to the above methods, it is also possible to perform self-checking by a method in which a permanent magnet or an electromagnet is disposed in the vicinity of the sensor part 300, a magnetic field is applied externally to the sensor part, and an induction current generated in the detection coils 304 when the sensor part is moved by the magnetic field is detected.

It is needless to say that these self-checking functions can be provided to the acceleration sensor chip of the third embodiment.

EMBODIMENT 5

Figure 19:
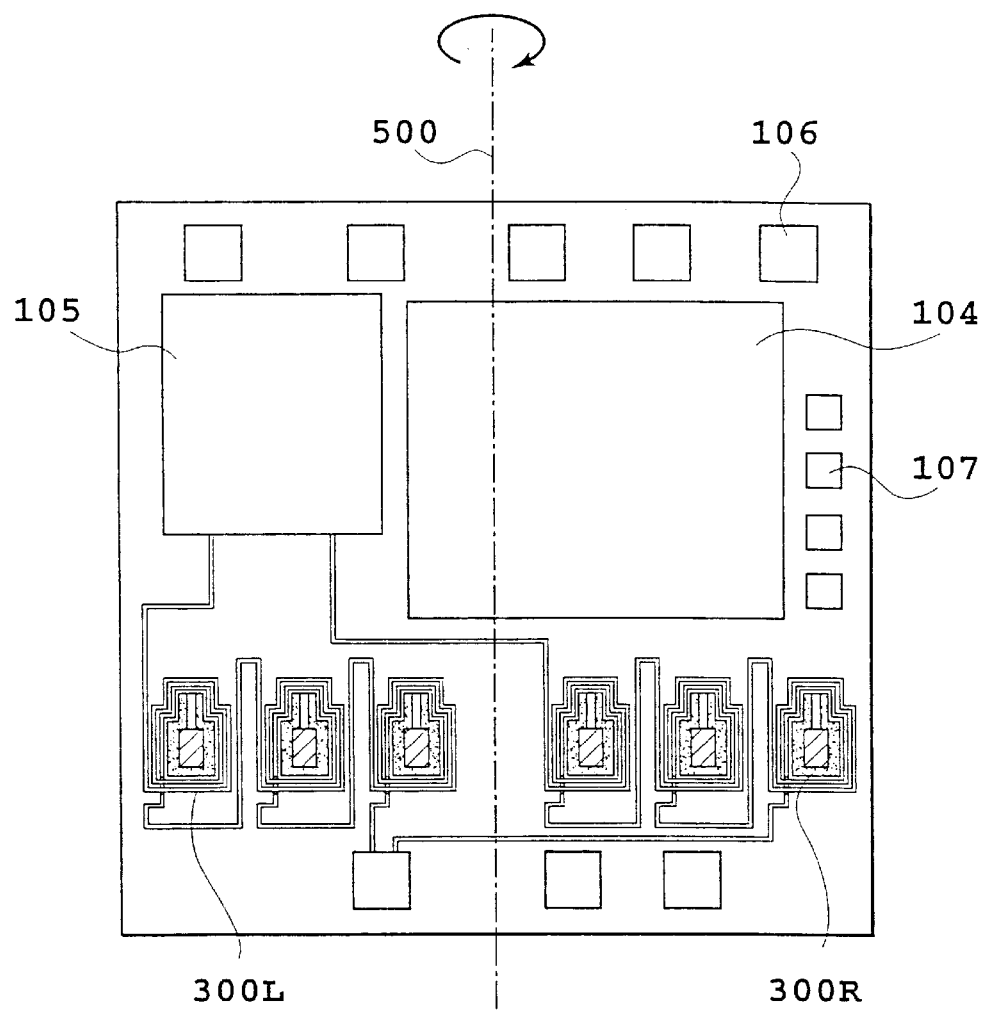
FIG. 19 is a schematic plane diagram showing the structure of an angular acceleration sensor chip as a fifth embodiment according to the present invention.

A fifth embodiment of the present invention is shown in FIG. 19. The fifth embodiment combines two units of the third embodiment shown in FIG. 11 or the fourth embodiment shown in FIG. 16 to detect an angular acceleration. In FIG. 19, three units each of sensors 300L and 300R are disposed symmetrically on the left and right of a detection axis 500. When an angular acceleration changes about the detection axis, for example, the weight part displaces upward in the left side sensor, and the weight part displaces downward in the right side sensor.

Figure 20:
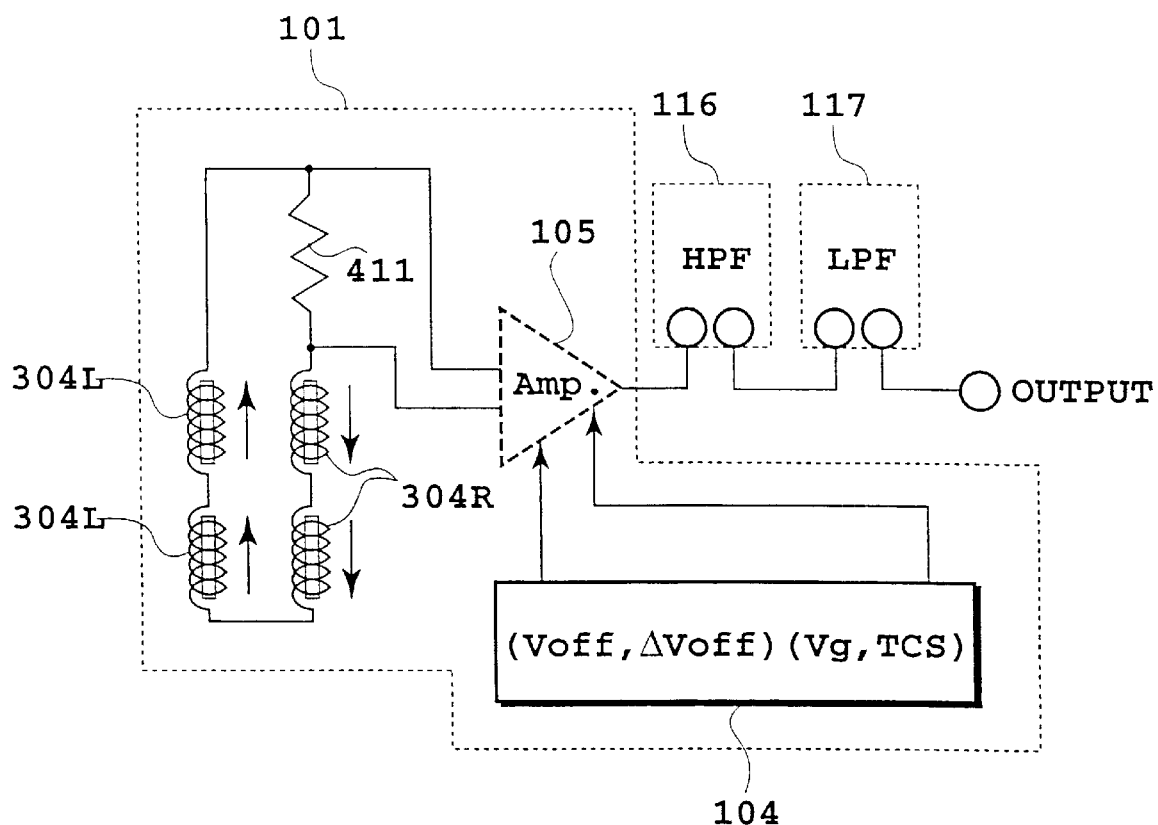
FIG. 20 is a circuit diagram showing an example of circuit construction in the angular acceleration sensor chip of the fifth embodiment.

As shown in FIG. 20, these sensors are wired to form a closed loop so that currents in the same directions flow in the detection coils 304L and 304R of the left and right sensor arrays when a change in angular acceleration generates about the detection axis 500. This current, as in the fourth embodiment, is converted into a voltage by the voltage conversion resistor 411, integrated and amplified. This enables the sensor chip to be used as an angular acceleration sensor chip for detecting an angular acceleration generated about the detection axis 500.

EMBODIMENT 6

Figure 21:
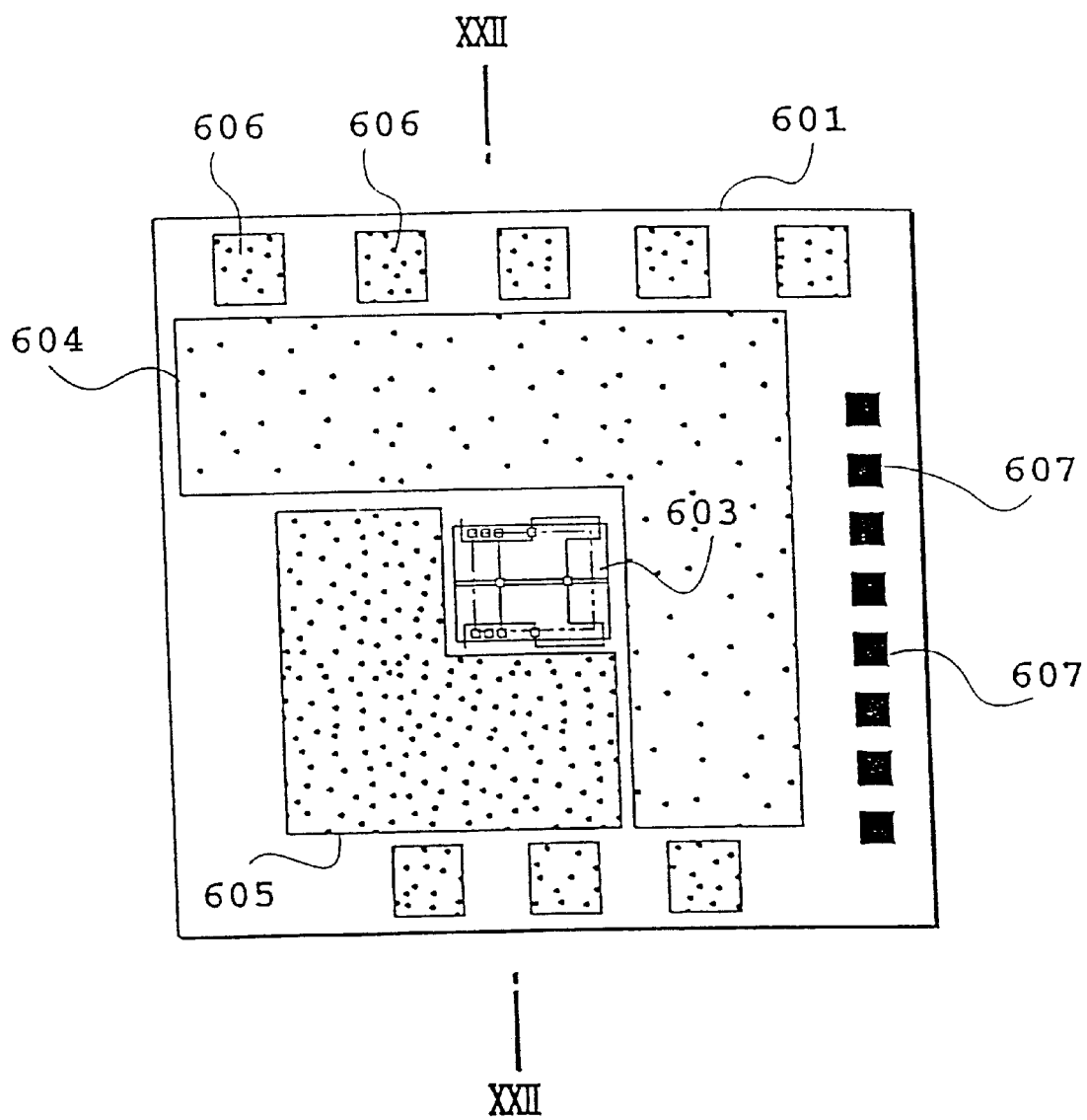
FIG. 21 is a plane diagram showing the surface structure of a sixth embodiment of the semiconductor sensor chip according to the present invention.
Figure 22:
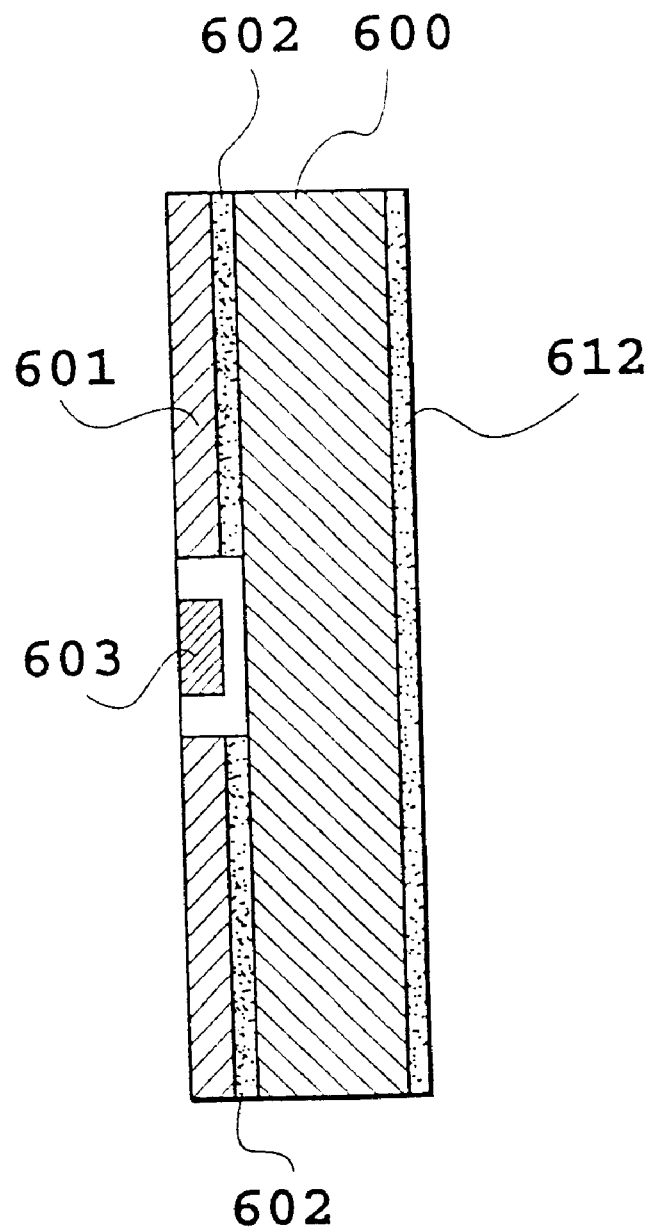
FIG. 22 is a sectional diagram taken along line XXII—XXII of FIG. 21.

FIGS. 21 and 22 shows the entire construction of an acceleration sensor chip according to a sixth embodiment of the present invention.

FIG. 22 is a sectional diagram of along the XXII—XXII line of FIG. 21. In FIG. 22, the sensor chip comprises a silicon substrate (hereinafter referred to as Si substrate) 600 as a first layer, a sacrificial layer 602 comprising SiO₂ as a second layer, and a silicon active layer (hereinafter simply referred to as active layer) 601 as a third layer. The active layer 601 is electrically separated from the Si substrate 600 by the sacrificial layer 602. Further, the Si substrate 600 is provided with a backside oxide film 612 formed on the backside located at the opposite side of the active layer 601. The backside oxide film 612 comprises a film which has a smaller thermal expansion coefficient than the silicon material of the first layer, for example, $SiO_2$, SiN or the like.

FIG. 21 shows a surface state of the active layer 601. The active layer 601 is provided with a circuit part comprising a sensor part 603 disposed at the center of the chip, a digital adjustment circuit 604 disposed on the periphery of the sensor part 603, an analog amplifier circuit 605, an input/output terminal 606, a digital adjustment terminal 607, and the like. The analog amplifier circuit 605 is a circuit for amplifying output of the sensor part 603, the digital adjustment circuit 604 is a circuit for performing sensor sensitivity correction, temperature correction, and the like, composed of, for example, a ROM. Further, the digital adjustment terminal 607 is a terminal for inputting data into the digital adjustment circuit 604.

Figure 23:
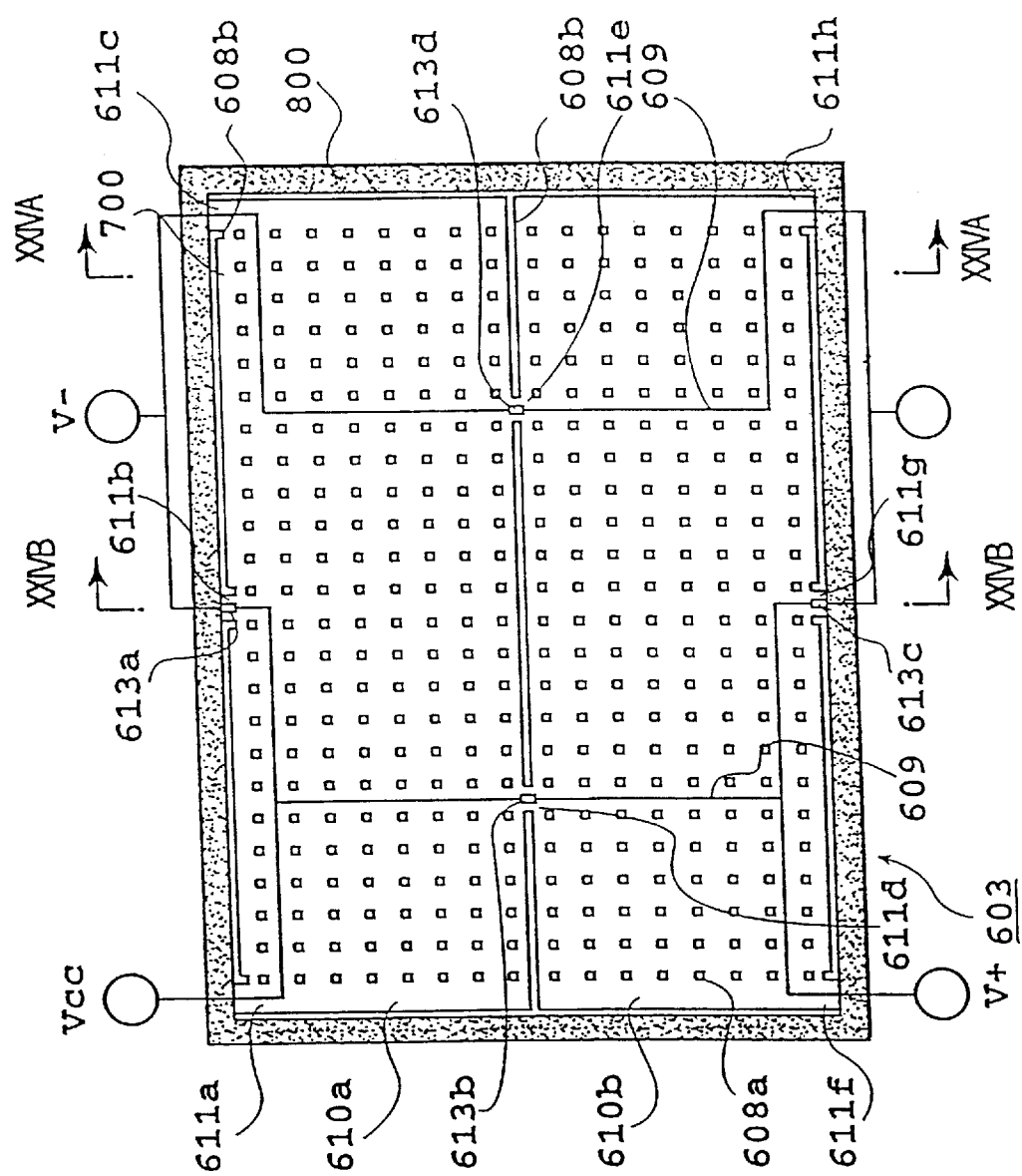
FIG. 23 is a plane diagram showing the structure of a sensor part of an acceleration sensor chip as a sixth embodiment according to the present invention.

FIG. 23 shows the structure of the sensor part 603. The sensor part 603 comprises a displaceable detection surface 700, and a support frame part 800 connected with the detection surface 700. The detection surface 700 comprises weight parts 610a and 610b, and beam parts 611a, 611b, 611c, 611d, 611f, 611g, and 611h. The weight parts 610a and 610b are provided with a plurality of through holes (cutouts) 608a and a plurality of slits (cutouts) 608b and are divided along the slit formation direction at the center. The weight parts 610a and 610b are connected with the beam parts 611d and 611e, and the weight parts 610a and 610b are connected with the surrounding support frame part 800 through the beam parts 611a, 611b, 611c, 611f, 611g, and 611h. The support frame part 800 is integrated with the active layer 601.

Further, the through holes 608a and the slits 608b provided on the sacrificial layer 602 are respectively for removing $SiO_2$ layer of the sacrificial layer 602 opposing the weight parts 601a and 610b and the beam parts 611a, 611b, 611c, 611d, 611e, 611f, 611g, and 611h and for separating the outer shape of the sensor part 603 from the active layer 601. Still further, a width or side of the through hole 608a and a width of the slit 608b are constant (in the present embodiment, a width of 2 $\mu$m or less, however, the width not limited to this particular value). in the detection surface 700 comprising the weight parts 601a and 610b and the beam parts 611a, 611b, 611c, 611d, 611e, 611f, 611g, and 611h, the sacrificial layer 602 of the lower part is removed, thereby making the detection surface 700 displaceable in a direction perpendicular to its surface.

Here, the weight parts 601a and 610b and the beam parts 611a, 611b, 611c, 611d, 611e, 611f, 611g, and 611h are equal in thickness, for example, 5 $\mu$m. Size of the weight parts 610a and 610b is set to, for example, 250 $\mu$m×850 $\mu$m and the width of the beam parts 611a, 611b, 611c, 611d, 611e, 611f, 611g, and 611h is set to, for example, 30 $\mu$m. In the beam parts 611b, 611d, 611e, and 611g, a total of four semiconductor strain gauges 613a, 613b, 613c, and 613d are formed by dopant diffusion, and by these four strain gauges, a Wheatstone bridge is formed as will be shown in FIG. 30 described later. The Wheatstone bridge is connected to a constant voltage power supply Vcc and a ground GND, and its output is conducted to V+ and V−. Further, the backside oxide film 112 has a thickness of, for example, 0.25 $\mu$m.

FIG. 24A is a XXIVA—XXIVA sectional diagram of FIG. 23. FIG. 24B is a XXIVB—XXIVB sectional diagram of FIG. 23. FIG. 24A is a sectional diagram at a position passing through the through hole 608a of the weight part 601a and 610b constituting the detection surface. FIG. 24B is a sectional diagram taken at a position passing through the slit 608b of the beam parts 611a, 611b, 611c, 611d, 611e, 611f, 611g, and 611h.

Next, a production method of the acceleration sensor chip of the sixth embodiment of the present invention will be described with reference to FIGS. 25 and 26.

Figure 25A:
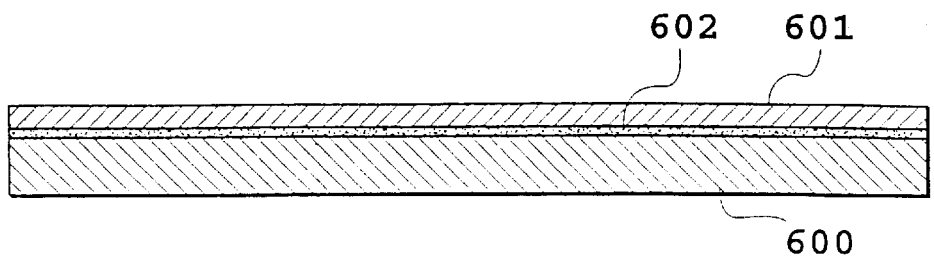
FIGS. 25A to 25D are process diagrams showing a production method of an acceleration sensor chip according to the present invention.

In a first step of FIG. 25A, a SOI wafer is prepared which comprises a single crystal Si substrate 600, a $SiO_2$ sacrificial layer 602, and a single crystal Si active layer 601. In the present embodiment, a 6 inch diameter wafer is used, the Si substrate 600 has a thickness of 625 $\mu$m, the sacrificial layer 602 is 1 $\mu$m in thickness, and the active layer 601 is 5 $\mu$m in thickness.

Figure 25B:
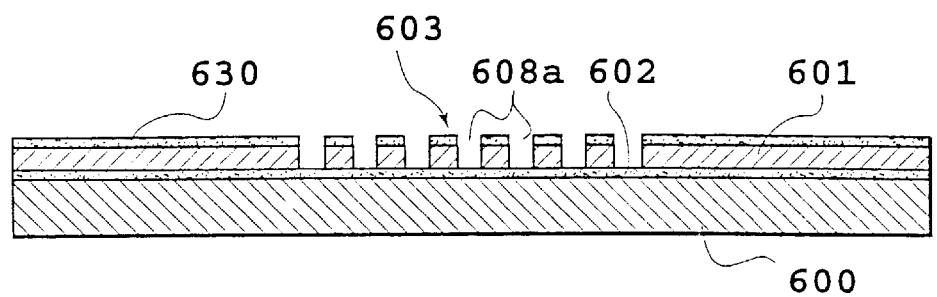

In a second step of FIG. 25B, a plurality of through holes 608a and a plurality of slits 608b for forming weight parts 610a and 610b and beam parts 611a, 611b, 611c, 611d, 611e, 611f, 611g, and 611h are formed by etching. In this case, by performing trench processing by RIE, plasma etching, wet etching or the like, the through holes 608a and the slits 608b can be formed with a uniform width of 2 $\mu$m or less over the entire surface of the detection surface, and the etching width reaches the insulation layer 602. Areas other than the etching area are coated previously with a protective film 630 on the surface, which is removed after completion of the etching processing.

Figure 25C:
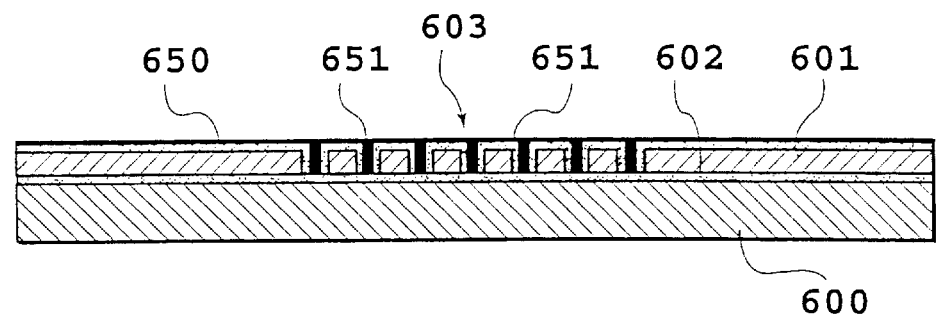

In a third step of FIG. 25C, the etched through holes 608a and slits 608b are filled with oxide film 650 and polysilicon 651. In the filling, first the oxide film 650 is formed inside the slit 608b and on the surface of the active layer 601. Formation of the oxide film 650 is performed using a diffusion furnace or the like. Next, on the surface on which the oxide film 650 is formed, polysilicon 651 is formed using CVD (Chemical Vapor Deposition) or the like. Thickness of the thus formed film, as an optimum film thickness from experience, is about 1 $\mu$m. The surface of the active layer 601 to which the oxide film 650 and polysilicon 651 are adhered is flattened by etching (plasma etching or wet etching or the like).

With the thus flattened SOI wafer surface, boron or phosphorus is ion implanted (or thermally diffused) at positions corresponding to semiconductor strain gauges 613a, 613b, 613c, and 613d in the sensor part 603 of the active layer 601 to form diffusion resistors.

Further, in the processing after flattening, a digital adjustment circuit 604, an analog amplifier circuit 603, terminals 606 and 607, wiring 609 and other devices necessary for circuit construction are also formed on the surface of the active layer 601 at the same time. Alternatively, the circuit part can be constructed using an ordinary process, for example, one which is used when constructing C-MOS.

Figure 25D:
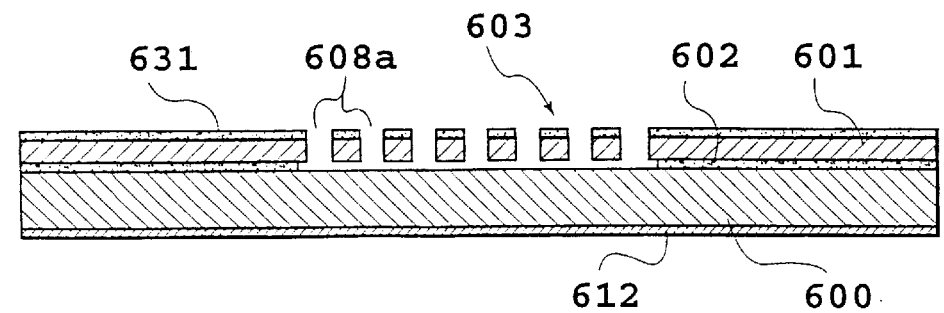

In a fourth step of FIG. 25D, a protective film 631 is provided over the entire surface of wafer, after patterning, $SiO_2$ of the insulation layer 602 opposing the positions of the weight parts 610a and 610b and the beam parts 611a, 611b, 611c, 611d, 611e, 611f, 611g, and 611h is removed by etching with an etching solution using buffered hydrofluoric acid (HF+$NH_4F$). At the same time, the oxide film 650 and the polysilicon 651 are removed by etching. Also, the oxide film 650 and the polysilicon 651 may be removed by plasma etching with $SF_6$+$O_2$ mixed gas. After that, the backside oxide film 612 is formed on the silicon substrate 600. Formulation of the backside oxide film 612 is not limited to the fourth step, but may be formed in any of first to fourth steps.

Next, FIGS. 26A to 26E are steps following above FIGS. 25A to 25D.

Figure 26A:
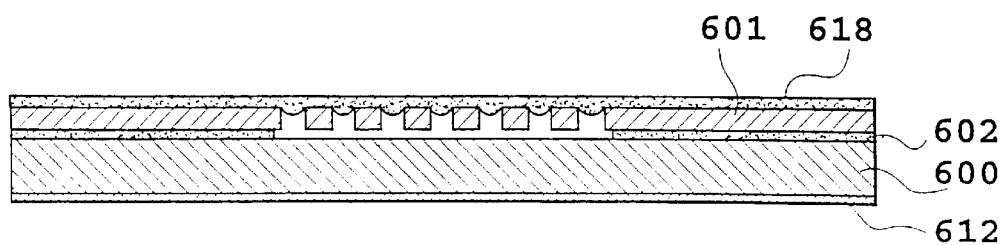
FIGS. 26A to 26E are process diagrams showing a production method following FIG. 25D.

In a fifth step of FIG. 26A, the protective film 631 is removed, and then the entire wafer surface is again coated with a protective film 618 such as a resist using a spinner. The protective film 618 is for protecting the sensor part 603 and the circuit part in the subsequent dicing step, and for preventing foreign matter from entering the gap formed between the sensor part 603 and the substrate 600.

Figure 26B:
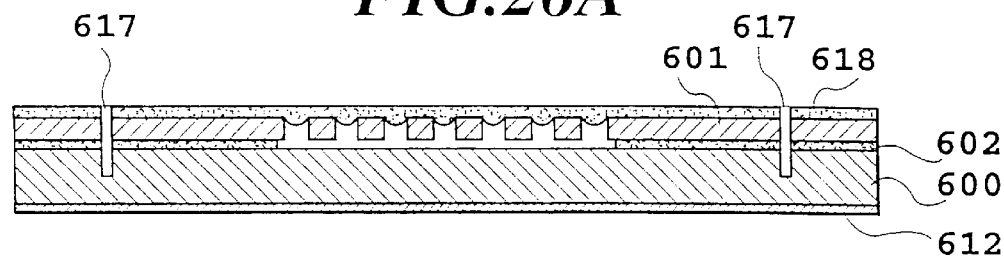

In a sixth step of FIG. 26B, slits 617 are formed by dicing for dividing the chip while remaining a small thickness of the wafer.

Figure 26C:
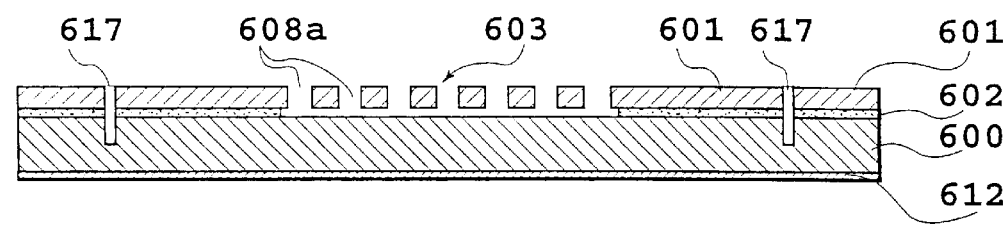

In a seventh step of FIG. 26C, the protective film 618 on the wafer surface is removed by ashing using an $O_2$ plasma.

Figure 26D:
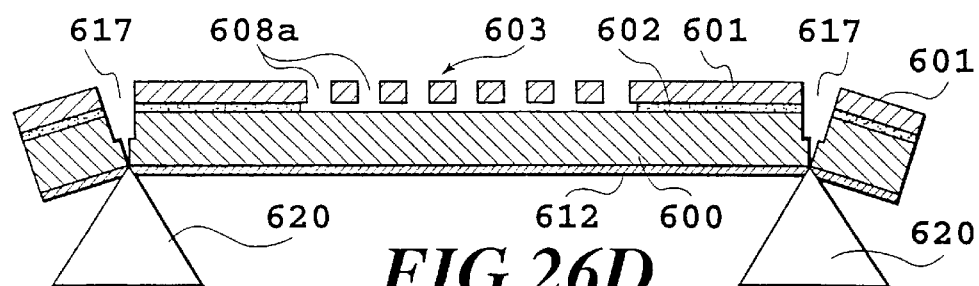
Figure 26E:
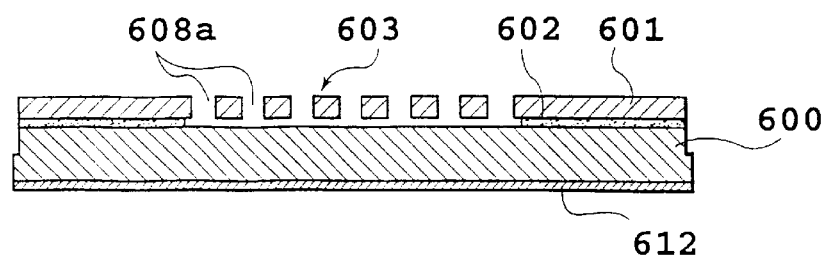

In an eighth step of FIG. 26D, the chip is divided using a tool 620 to concentrate a stress on the slits 617.

In a ninth step of FIG. 25E, the thus divided chip is completed.

As described above, when fabricating the sensor part, by forming the through holes 608a and slits 608b of a constant width (e.g., less than 2 μm) over the entire detection surface, etching can be efficiently carried out and filling with polysilicon 651 or the like be performed uniformly over a large area. This allows for fabricating a number of sensor chips using not only the prior art 4-inch wafer but also a large-diameter wafer of 5 or 6 inches in diameter (for example, about 500 to 600 μm in thickness). The process also prevents foreign matter from entering the gap between the substrate 600 and movable parts of the sensor part 603 (weight parts and beam parts) during the fabrication process.

Further, a latent internal stress in the SOI wafer can be balanced by forming the backside oxide film 612, whereby suppressing as possible a strain and stress generated in the sensor part 603.

Next, the reason why in the above production method, the width of the cutouts formed over the entire surface of the sensor part 603, that is, the width of the through holes 608a and slits 608b are a constant value, and the width is 2 μm or less will be described with reference to FIGS. 27, 28, and 29.

Figure 27A:
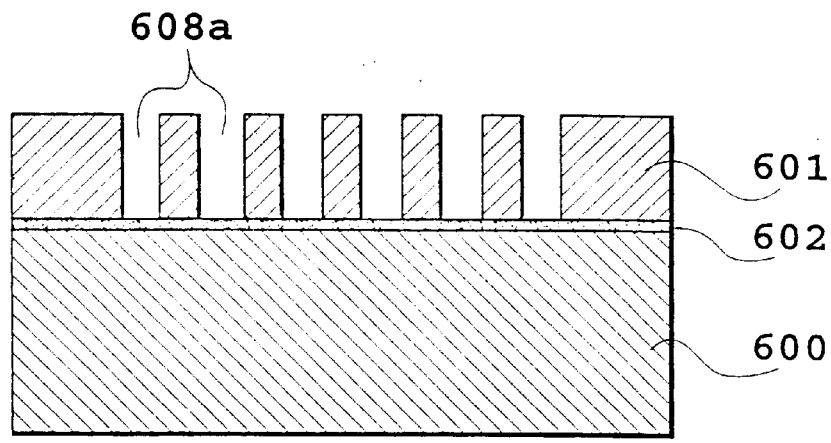
FIG. 27A and 27B are process diagrams for comparing etching steps of a uniform cutout width and an irregular cutout width.
Figure 27B:
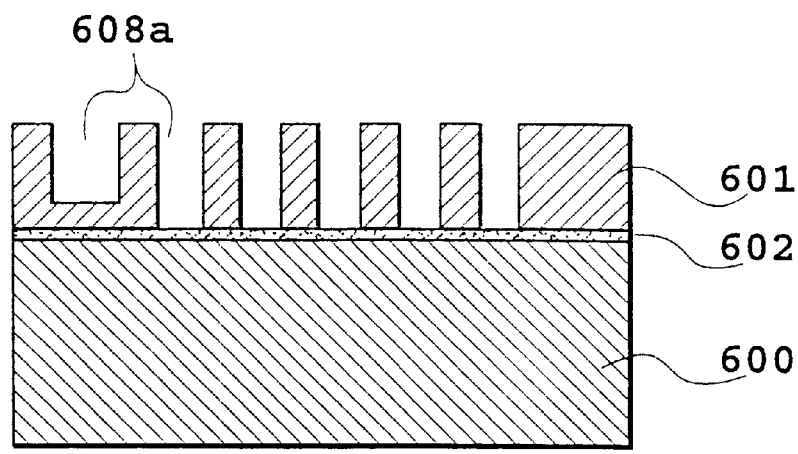

First, FIG. 27A shows an example when the width is uniformly formed in the second step of the present invention. FIG. 27B is an example when the width is irregular. When the width is uniform as in the present invention of FIG. 27A, etching is made in a same depth, however, when the width is irregular as in FIG. 27B, an unetched part is generated even after passage of a time, and this tendency becomes more apparent as the area of the detection surface to be etched becomes large. Therefore, in the present invention, the width of the through hole 608a and the slit 608b is formed in a constant value.

Figure 28A:
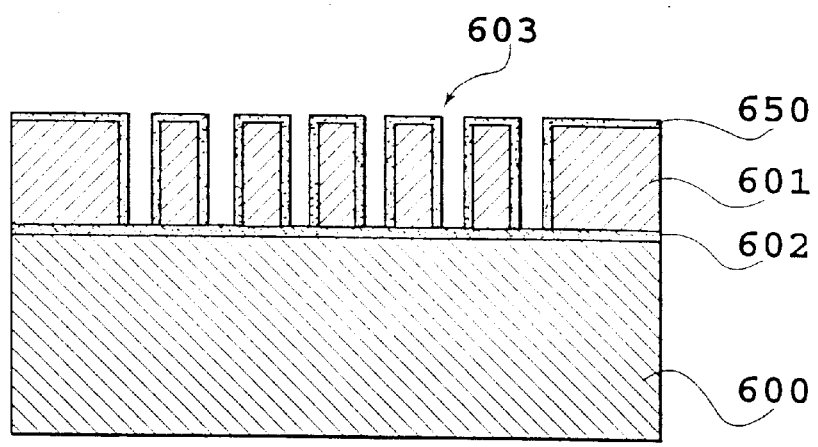
FIGS. 28A to 28C are process diagrams for explaining filling condition when the cutout width is uniform.
Figure 28B:
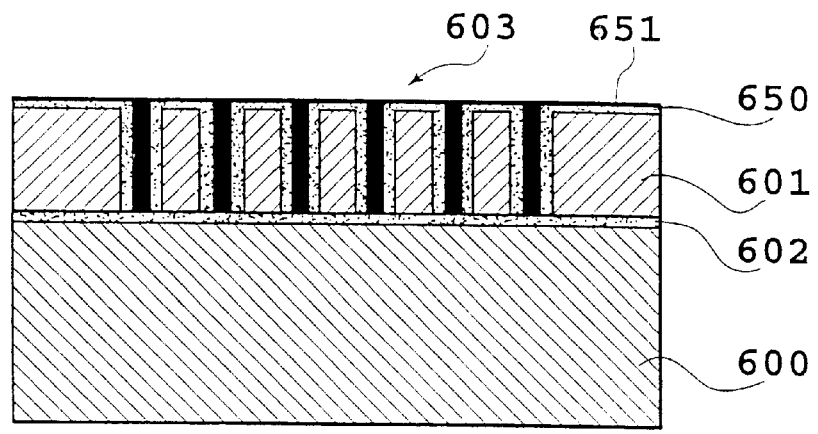
Figure 28C:
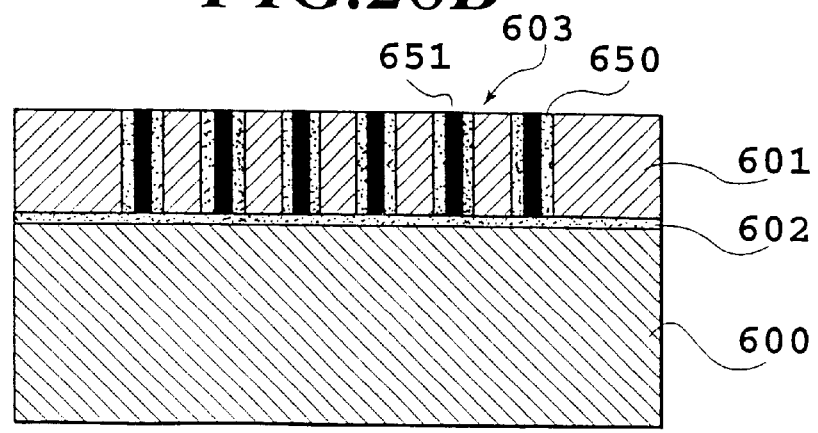
Figure 29A:
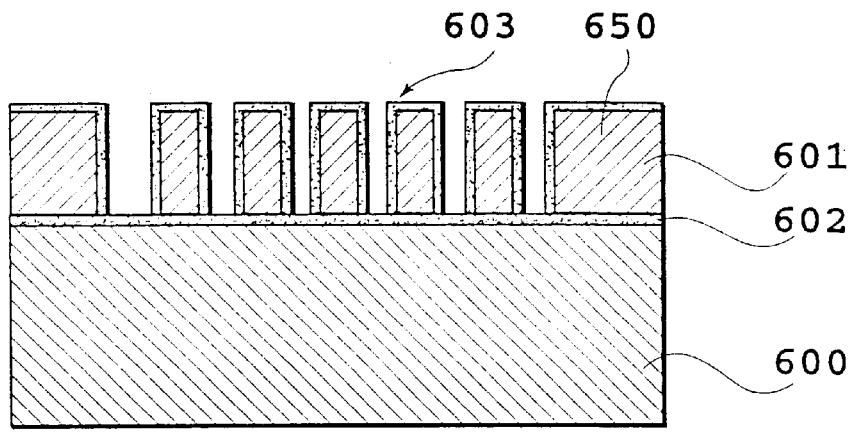
FIGS. 29A to 29C are process diagrams for explaining filling condition when the cutout width is irregular comparing with FIGS. 28A to 28C.
Figure 29B:
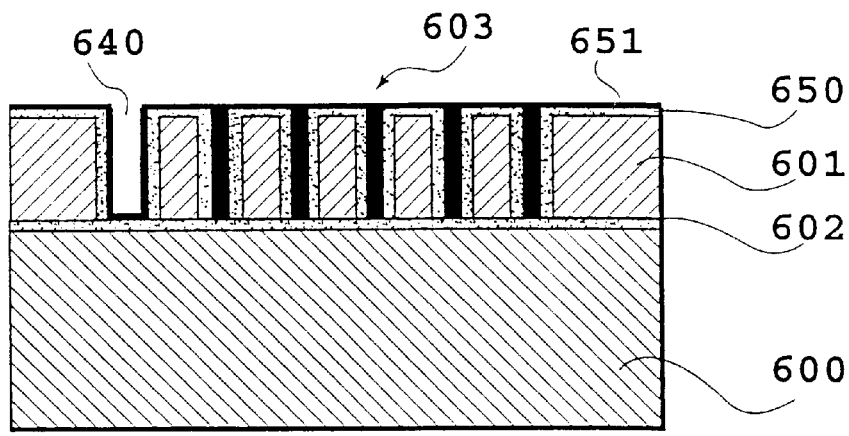
Figure 29C:
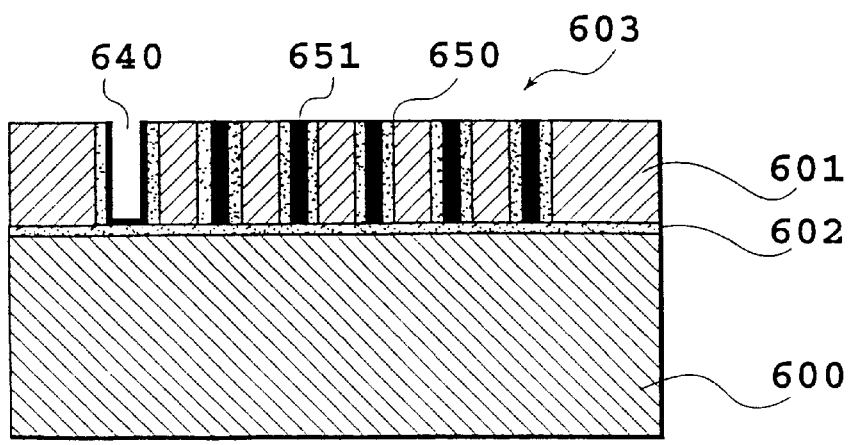

Further, FIGS. 28A to 28C show an example when the width in the third step of the present invention is formed in a uniform value of 2 μm or less. FIGS. 29A to 29C show an example when the width is irregular. Now, if the width is assumed as 2 μm, in the present invention, in the stage where the oxide film 650 of FIG. 28A is formed, in consideration of the film thickness, the width of the through hole 608a and the slit 608b is about 1.8 μm. When polysilicon 651 of FIG. 28B is formed to a thickness of about 1 μm on the active layer 601, adherence advances by each about 0.9 μm simultaneously from the surfaces of the opposing sides on the inner wall surface of the through holes 608a and the slits 608b, in the stage where the holes are filled with polysilicon 651, also on the active layer 601, polysilicon 651 is adhered in a desired thickness of about 1 μm.

On the other hand, when the width is irregular, as in FIG. 29, when the oxide film 650 is formed, there exists an area where the width of the through hole 608a and the slit 608b is over 2μm. In such a state, when polysilicon 651 is formed in a film thickness of about 1 μm, as shown in FIG. 29B, in the through hole 608a and the slit 608b, there is an area of not completely filled, and partial hollow 640 is generated.

In the present invention, when the surface of the active layer 601 is flattened by etching, as in FIG. 28C, the hole part is completely filled and flattened. However, in the case of FIG. 29C, the hollow 640 remains. Therefore, for the above reasons, the width of the through hole 608a and the slit 608b in the present invention is set to 2 μm or less over the entire surface of the sensor part 603.

Figure 30:
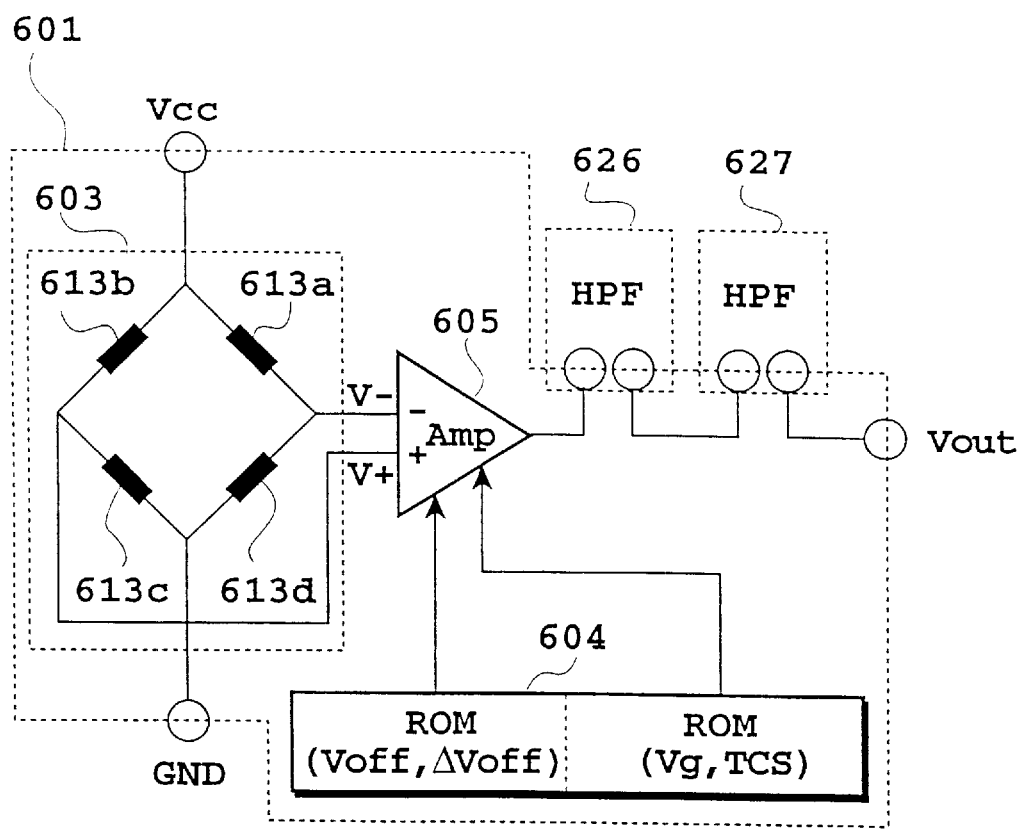
FIG. 30 is a block diagram showing the structure of an acceleration detection circuit using the acceleration sensor chip according to the present invention.

Next, construction of an acceleration detection circuit using the above acceleration sensor chip will be described with reference to FIG. 30.

Outputs V+ and V− of a Wheatstone bridge composed of four semiconductor strain gauges 613a, 613b, 613c, and 613d are inputted in and amplified by an amplifier circuit 605. In this case, when an acceleration is applied in a perpendicular direction from the surface on which the sensor part 603 is formed towards the Si substrate 600 side, the strain gauges 613b and 613d formed on the beam parts 611d and 611e between the weight parts 601a and 610b are subjected to a compressive stress and decrease in resistance, and the strain gauges 613a and 613c formed on the beam parts 611b and 611g between the weight parts 601a and 610b and the active layer 601 as the peripheral support part are subjected to a tensile stress and increase in resistance. As a result, a sensor output according to the magnitude of acceleration is obtained from the Wheatstone bridge, which is amplified by the amplifier circuit 605.

Further, from the digital adjustment circuit 604, data Vg for sensitivity correction, data TCS for correcting temperature characteristic of sensitivity, offset voltage Voff (sensor output when no acceleration is applied), and correction value ΔVoff for correcting deviation of offset voltage are inputted in the amplifier circuit 605. Output of the amplifier circuit 605 is obtained as an output Vout through a high-pass filter 626 and a low-pass filter 627.

Thus, a detection result that is corrected as necessary can be obtained as bridge output voltage Vout. The high-pass filter 626 and the low-pass filter 627 may be external circuits. Their frequency response area adjustment parts and the like may be incorporated in the digital adjustment circuit 604. In the sensor chip constructed with these parts, when the through hole 608a and the slit 608b are formed, depths thereof are processed uniformly, and the outer shape of the sensor part 603 can be formed with good precision. Further, due to the backside oxide film 612 formed on the substrate 600, any latent internal stress in the SOI can be balanced, thereby reducing strain to the sensor part 603.

Next, the effect of the backside oxide film 612 will be described with reference to FIG. 31.

Figure 31:
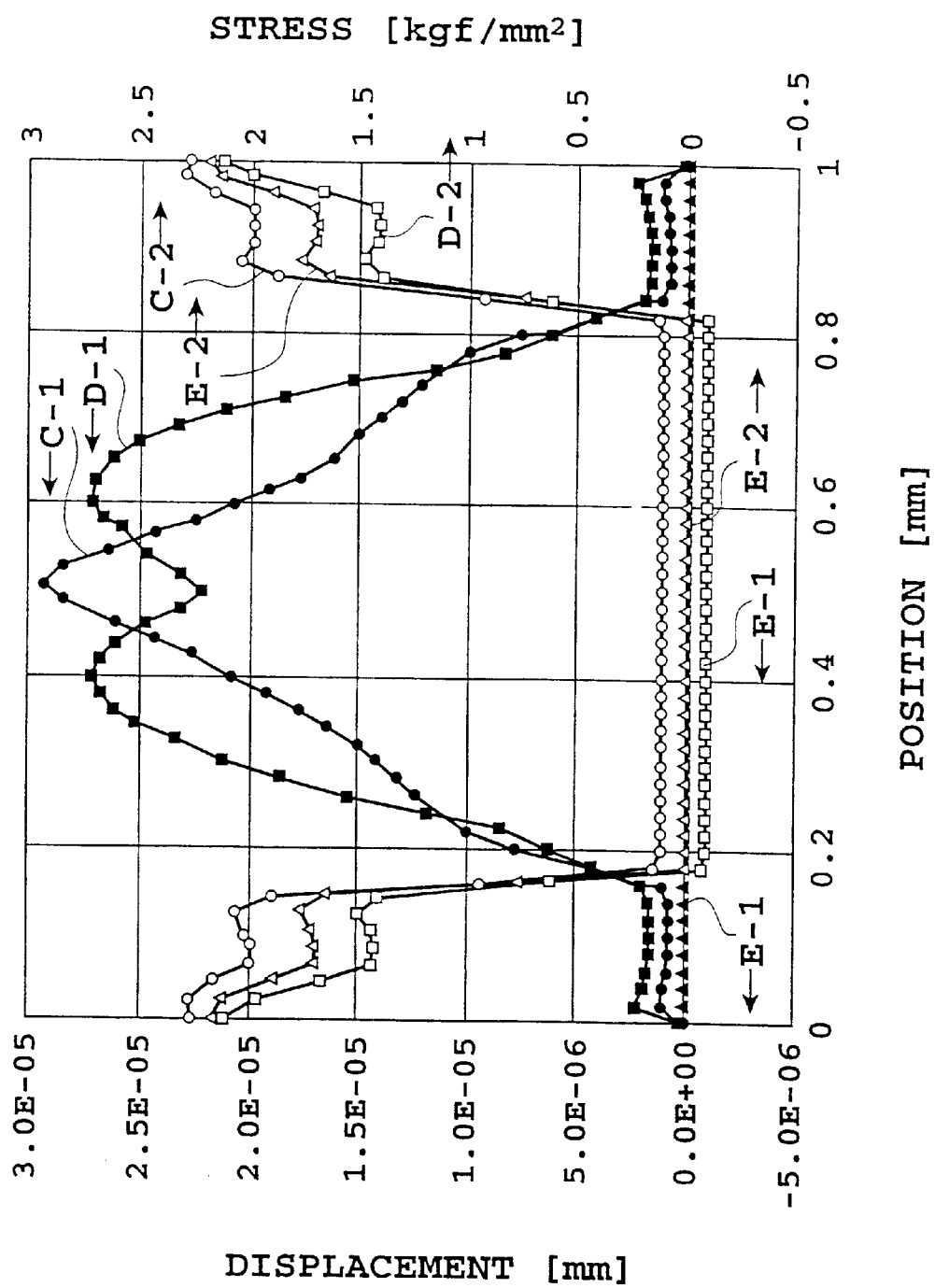
FIG. 31 is a characteristic diagram explaining an effect of a backside film.

FIG. 31 shows a result confirmed by FEM (finite element method) analysis. Strain distribution and stress distribution in a thickness direction between A–B (see FIG. 23) parallel to the surface of the active layer 601, obtained by FEM analysis, are shown. In this case, part of 0.2 mm to 0.8 mm in the position of the abscissas corresponds to the sensor part 603. Strain with no backside oxide film 612 is shown as C-1 (-•-), and stress as C-2 (-○-). When the thickness of the backside oxide film 612 is 0.5 μm, strain is D-1 (-■-), and stress is D-2 (-□-) When the thickness of the backside oxide film 612 is 0.25 μm, strain is E-1 (-▲-), and stress E-2 (-Δ-).

From these results of analysis, in the case of the present embodiment, strain and stress generated in the sensor part can be minimized by setting the thickness of the backside oxide film 612 to 0.25 μm.

Figure 2A:
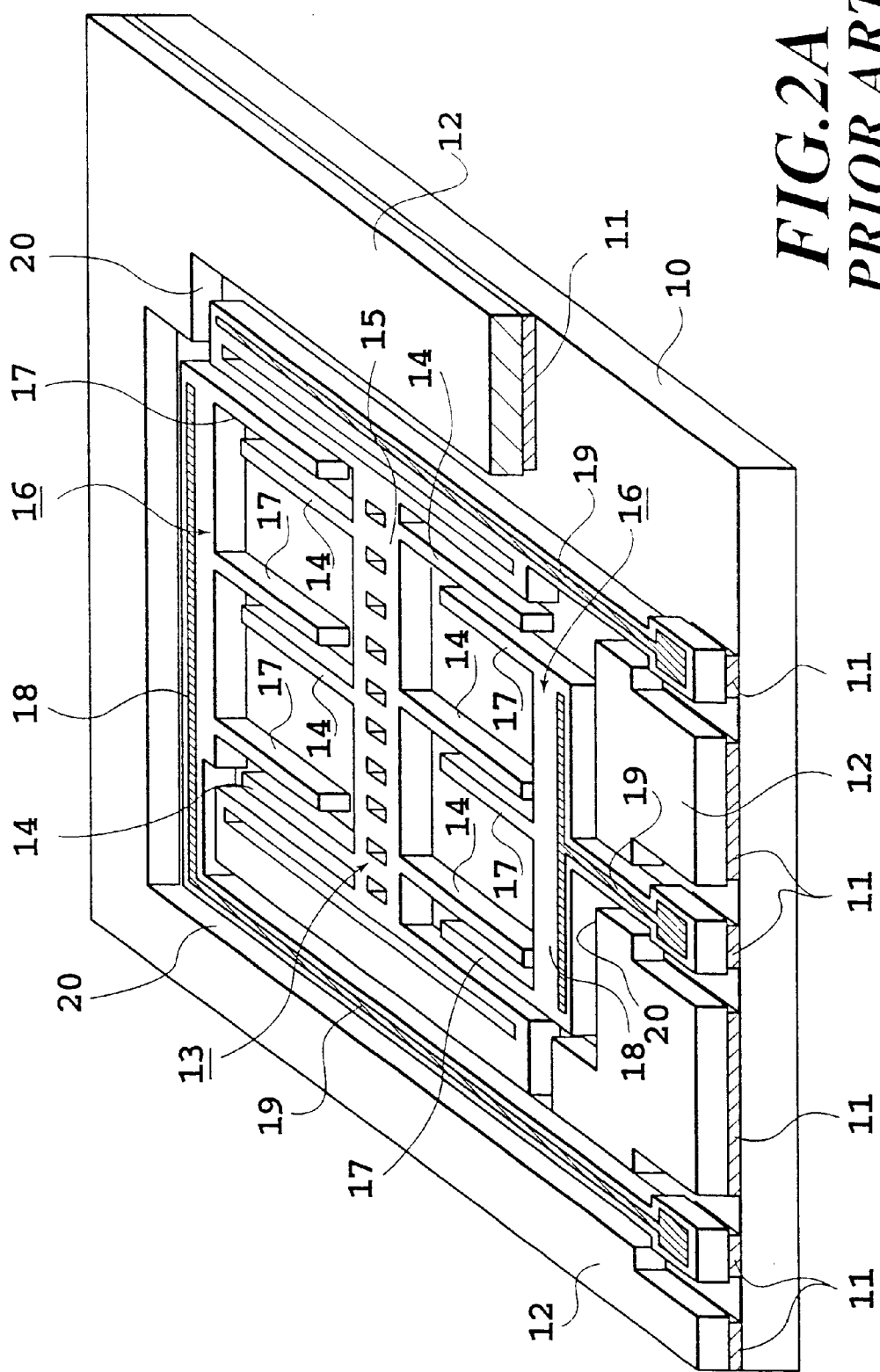
FIG. 2A is a diagram showing a second prior art example of an acceleration sensor ship.
Figure 2B:
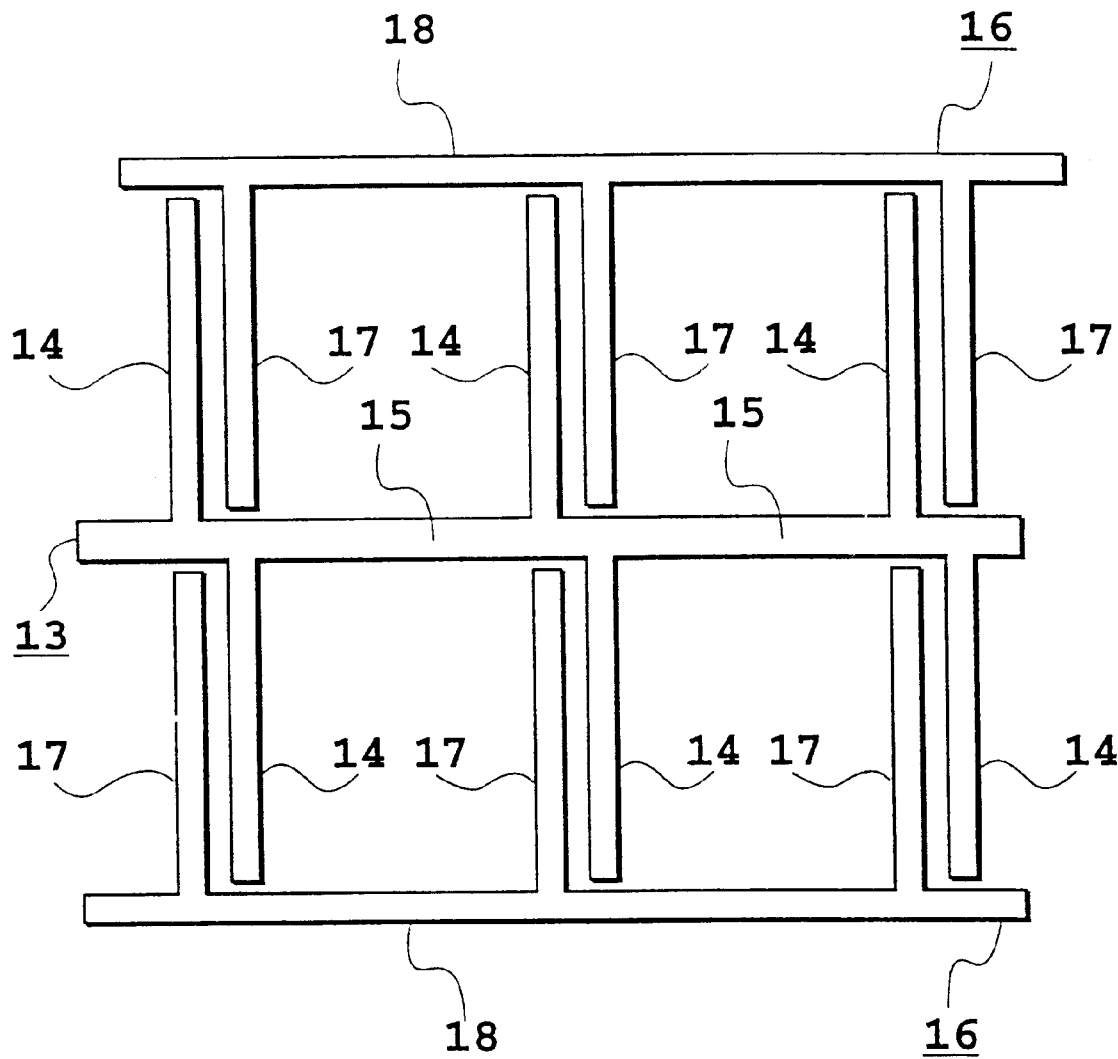
FIG. 2B is a simplified plane diagram showing a comb electrode part of FIG. 2A.

In the present embodiment, using the above SOI wafer, the acceleration sensor chip for making detection by the semiconductor strain gauge has been described, however, the present invention is not limited to this. In addition to the above, the present invention can also be applied similarly, for example, to a capacitive type sensor using SOI wafer and a capacitive type sensor using wafer in which polysilicon is formed as a third layer on a single crystal silicon substrate through an insulation layer. Further, when applied to the capacitive type sensor, described with reference to FIG. 2B, the sensor chip can be fabricated by forming a cutout (hole or the like) disposed at the center of the displaceable first support body 13, especially in the area of straight mass body 15.

EMBODIMENT 7

The present embodiment describes an example of the semiconductor sensor according to the present invention, which is shown in FIG. 32. FIG. 32A is a front diagram, FIG. 32B is a side diagram, FIG. 32C is a sectional diagram taken along line XXXIIC—XXXIIC of FIG. 32A, and FIG. 32D is a sectional diagram taken along line XXXIID—XXXIID of FIG. 32A. FIG. 32A shows a state with a cover 921 shown in FIG. 32C removed.

For example, a package 920 made of epoxy resin has a sensor fixing surface 920A for fixing a semiconductor sensor chip 910, a cover 921, and a plurality of pins 922 disposed in parallel along two side surfaces sandwiching the sensor fixing surface 920A and protruding from a package bottom surface with part thereof buried in a package main body. The sensor fixing surface 920A is provided with a plurality of wire bond pads 923 for supplying current to the acceleration sensor chip and leading a detection signal to the outside. Each of the wire bond pads 923 is connected to each of the pins 922 with wiring 925. In practice, the wire bonding pad 923 and the wiring 925 can be formed of an integral metal thin plate. That is, a metal thin plate is punched into a desired form, subjected to bending to be bonded to the sensor fixing surface 920A and the package side surface, and connected with the pin 922 by soldering. Further, the outer peripheral surface of the package is coated with epoxy resin or the like to bury the wiring part in the package, which is preferable in view of protection of wiring. The semiconductor sensor chip 910 is fixed to the sensor fixing surface 920A of the thus fabricated package with an adhesive or the like. The semiconductor sensor chip 910 is a sensor chip for detecting a physical value, for example, an acceleration, applied in a direction 930 perpendicular to its surface. The wire bond pad 923 is electrically connected to an input/output terminal (not shown) of the semiconductor sensor chip 910. In the present example, connection by wire bonding using a wire 924 is shown. Finally, the cover 921 is bonded to the package main body. A semiconductor sensor is thus fabricated. This structure is similar to a package structure known as DIP (dual in-line package). As shown, each of the plurality of pins 922 is constructed independent of others in the package, so that the respective pins do not interfere with each other. Further, since the wiring 925 is buried in the package, it will never vibrate. Still further, since the package 920 is sealed with the cover 921, the semiconductor sensor chip 910 will never be exposed to the external environment.

Figure 33:
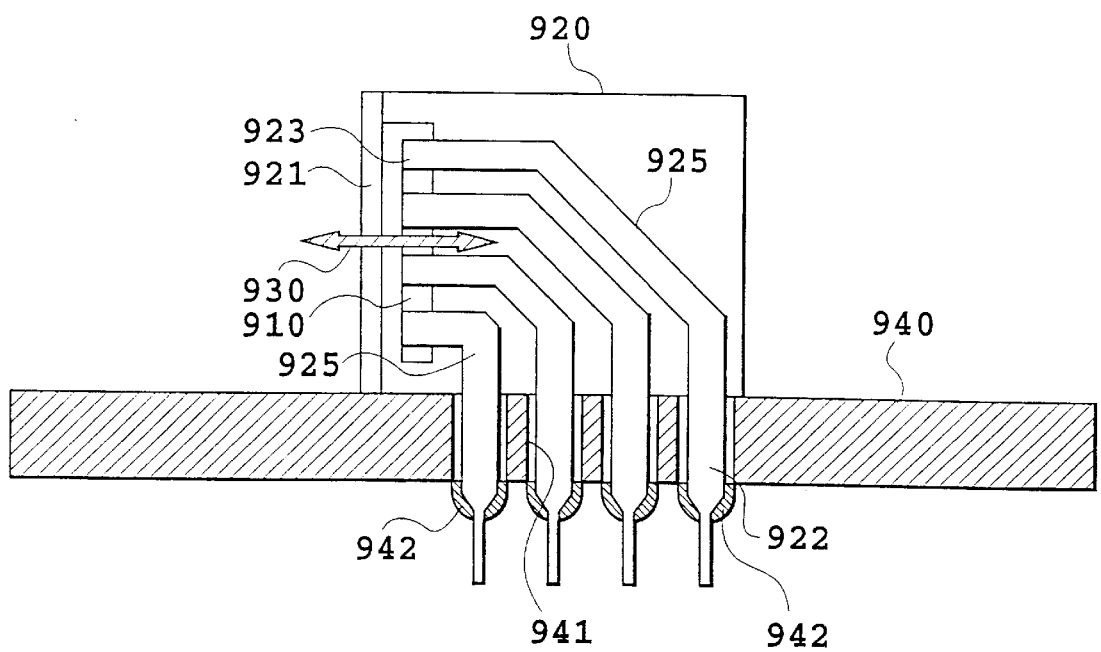
FIG. 33 is a schematic sectional diagram for explaining a mounting method of the semiconductor sensor according to the present invention to a printed circuit board.

As described above, the semiconductor sensor packaged with a semiconductor sensor chip 910 is mounted to a printed circuit board 940 as in ordinary IC parts. FIG. 33 explains the mounting of the sensor chip package 920 on a printed circuit board 940, showing a cross section corresponding to FIG. 32D. The pins 922 of the package 920 are inserted in mounting through-holes 941 of a printed circuit board 940, and bonded with a solder 942 or the like from the lower surface of the printed circuit board. With this method, the semiconductor sensor can be mounted to the printed circuit board by quite the same method as mounting of DIP. The input terminal of the semiconductor sensor chip is connected to a power supply by a wiring (not shown) connected with the mounting through-holes 941 of the printed circuit board 940, and a signal corresponding to the physical value detected by the semiconductor sensor can be outputted to the outside. When detecting the physical value, the printed circuit board is disposed so that the sensor chip surface of the semiconductor sensor mounted to the printed circuit board opposes correctly to the direction of physical value to be detected.

By mounting the semiconductor sensor using the above-described package, the mounting area on the printed circuit board can be considerably reduced, and the semiconductor sensor can be fixed so that the semiconductor sensor chip is in line with the direction of physical value to be detected, that is, the direction perpendicular to the surface of the semiconductor sensor chip is parallel to the surface of the printed circuit board, and in line with the arrangement direction of the plurality of mounting through-holes.

Figure 3:
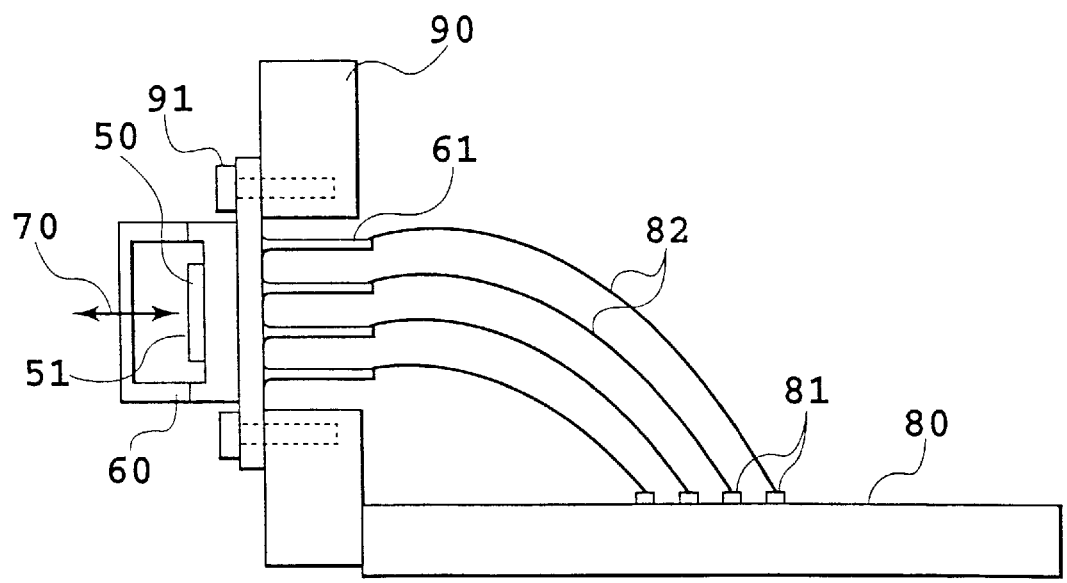
FIG. 3 is a schematic perspective diagram showing an example of prior art semiconductor sensor.

The semiconductor sensor chip 910 sealed in the package 920 is constructed in an integral silicon substrate, for example, as shown in FIG. 3, which may be an acceleration sensor chip for detecting an acceleration generated in a direction 70 perpendicular to the sensor chip surface, or be an acceleration sensor chip described in Japanese Patent Application Laid-open No. 5-273229 (1993) or its corresponding U.S. Pat. No. 5,490,421. However, the acceleration sensor chip and the angular acceleration sensor chip set forth are most acceptable for assembling the semiconductor sensor according to the present invention.

The present invention can be applied not only to the above-described acceleration sensor and angular acceleration sensor but also to a semiconductor sensor for detecting physical values in which directivity is important. Further, in the semiconductor sensor shown in FIG. 33, an example is shown in which the main surface for mounting the semiconductor sensor chip is substantially perpendicular to the surface of the printed circuit board for mounting the package. However, the angle of the main surface for mounting the semiconductor sensor chip with respect to the surface of the printed circuit board for mounting the package can be flexibly selected in relation to the direction of the physical value to be detected and the mounting position of the printed circuit board constituting the sensor assembly.

Figure 34:
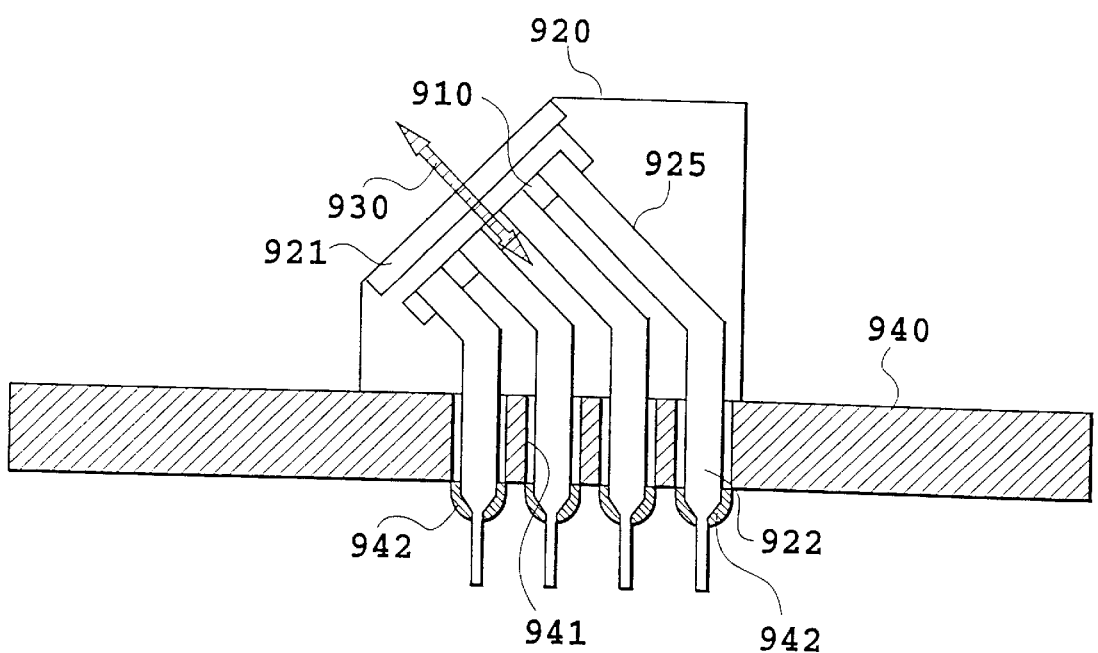
FIG. 34 is a schematic diagram for explaining another example of semiconductor sensor according to the present invention.

FIG. 34 shows an example thereof, in which a direction 930 of physical value applied perpendicular to the surface of the semiconductor sensor chip is 45 degrees with respect the a printed circuit board 940. Since reference numerals are similar to those in FIG. 33, detailed description thereof is omitted. In this case, the main surface of the semiconductor sensor package for mounting the semiconductor sensor chip 910 is in a direction of 45 degrees with respect to the printed circuit board 940. As shown, the main surface of the package mounting the semiconductor sensor chip for detecting a physical value applied in a direction perpendicular to the surface of the semiconductor sensor chip is selected in consideration of the direction of the physical value to be detected and the actual mounting direction of the printed circuit board.

As described above, the present invention provides the following advantages.

Since acceleration sensor chips can be produced using a large-diameter wafer, a cost reduction is possible.

In the dicing process for dividing the wafer into respective chips having formed thereon sensor part, foreign matter entering the sensor structure is reduced, thereby achieving a high yield in the production process.

Since a detection principle by a semiconductor strain gauge or a magnetic thin film and a coil is used, if small foreign matter of a size that does not disturb the movement of the sensor structure is present in the gap, the influence on the sensor signal is small.

An acceleration sensor chip with a wide measurement range and a high sensitivity can be achieved.

Since bulk silicon is used for the sensor structure, a highly reliable acceleration sensor chip with repeatability of mechanical characteristics can be achieved.

The present invention can be applied to an angular acceleration sensor chip.

The mounting area of the sensor chip can be reduced, and the entire detection system including the sensor be downsized.

As in ordinary ICs, solder-mounting is possible by pins to the printed circuit board, and the production process of the semiconductor sensor can be easily automated, thereby reducing the production cost.

Since mounting of the sensor chip to the package is possible by inserting pins into the printed circuit board, direction of the physical value to be detected and direction of the sensor chip can be positively positioned in a single direction, thereby improving reliability of the detection signal.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor sensor package for incorporating a semiconductor sensor chip characterized in that a main surface for mounting said semiconductor sensor chip is formed at a predetermined angle with respect to a printed circuit board for mounting said package, said main surface is provided with a plurality of terminals along two opposite parallel sides thereof for connecting with input/output terminals of said semiconductor sensor chip, a bottom surface perpendicular to said main surface is provided with a plurality of pins respectively formed along two sides parallel to said main surface, which plurality of pins are inserted into mounting holes formed in said printed circuit board, and said plurality of terminals provided along said two opposite parallel sides and said plurality of pins are electrically connected.

2. The semiconductor sensor package as claimed in claim 1, wherein said main surface for mounting said semiconductor sensor chip is formed substantially perpendicular to the surface of the printed circuit board mounting said package.

3. The semiconductor sensor package as claimed in claim 1, wherein wiring for connecting said plurality of terminals and said plurality of pins is buried in said package.

4. The semiconductor sensor package of claim 1, further comprising a cover.

5. The semiconductor sensor package of claim 1, wherein the main surface for mounting comprises a sensor fixing surface, said sensor fixing surface comprising a plurality of wire bond pads for supplying current to said semiconductor sensor chip and for a detection signal output, and wherein said wire bond pads are electrically connected to said pins.

6. The semiconductor sensor package of claim 5 wherein said wire bond pads are formed of an integral metal thin plate and connected to said pins by soldering.

7. The semiconductor sensor package of claim 1, said package comprising an epoxy resin.

* * * * *